US007176910B2

(12) United States Patent
Tsuchi

(10) Patent No.: US 7,176,910 B2
(45) Date of Patent: Feb. 13, 2007

(54) DRIVING CIRCUIT FOR DISPLAY DEVICE

(75) Inventor: Hiroshi Tsuchi, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 541 days.

(21) Appl. No.: 10/772,600

(22) Filed: Feb. 6, 2004

(65) Prior Publication Data

US 2004/0155892 A1 Aug. 12, 2004

(30) Foreign Application Priority Data

Feb. 12, 2003 (JP) ............................ 2003-034130

(51) Int. Cl.
*H03B 1/00* (2006.01)

(52) U.S. Cl. .......................... 345/204; 345/52; 345/93; 345/99; 327/108; 327/407; 327/410; 327/560; 327/563; 330/150

(58) Field of Classification Search .................. 345/52, 345/93, 99, 204; 326/82; 327/103, 108, 327/407, 410, 560, 563; 330/150, 253
See application file for complete search history.

(56) References Cited

U.S. PATENT DOCUMENTS 4,077,012 A * 2/1978 Iwamatsu .................. 330/253
6,879,534 B2 * 4/2005 Perner et al. ............... 365/209

FOREIGN PATENT DOCUMENTS

| | | |
|---|---|---|
| JP | 9-130171 | 5/1997 |
| JP | 2001-284988 | 10/2001 |
| JP | 2002-55659 | 2/2002 |
| JP | 2003-22055 | 1/2003 |

* cited by examiner

*Primary Examiner*—Bipin Shalwala
*Assistant Examiner*—Vincent E. Kovalick
(74) *Attorney, Agent, or Firm*—Young & Thompson

(57) ABSTRACT

A driving circuit for driving a capacitive load promptly to a target voltage is to have a broad dynamic range and achieve a high accuracy output and saving in the surface area with low power dissipation. A first period and a second period are provided in one data driving period. During the first period, a transistor amplifier for driving the load for charging, with a setting drive voltage (V1), and a transistor amplifier for driving the load for discharging, with a setting drive voltage (V2), with V1<V2, are both enabled for actuation and, during the second period, the transistor amplifier performing either the driving for charging or the driving for discharging, and a constant current source, performing the reverse of the operation of the transistor amplifier, are actuated, for driving the load to the target voltage.

28 Claims, 16 Drawing Sheets

FIG . 2

| DRIVING | DEVICE | 1ST DATA DRIVING PERIOD | | 2ND DATA DRIVING PERIOD | |
|---|---|---|---|---|---|
| | | 1ST PERIOD | 2ND PERIOD | 1ST PERIOD | 2ND PERIOD |
| CHARGING | TRANSISTOR 101 | ACTIVE | ACTIVE | ACTIVE | INACTIVE |
| | CONSTANT CURRENT SOURCE 103 | INACTIVE | INACTIVE | INACTIVE | ACTIVE |
| DISCHARGING | TRANSISTOR 102 | ACTIVE | INACTIVE | ACTIVE | ACTIVE |
| | CONSTANT CURRENT SOURCE 104 | INACTIVE | ACTIVE | INACTIVE | INACTIVE |

FIG . 5

| | (Vth203, Vth204) | (Vth303, Vth304) | (Ids203, Ids204) | (Ids303, Ids304) |
|---|---|---|---|---|
| ① | Vth203>Vth204 | Vth303=Vth304 | Ids203=Ids204 | Ids303=Ids304 |
| ② | Vth203=Vth204 | Vth303<Vth304 | Ids203=Ids204 | Ids303=Ids304 |
| ③ | Vth203=Vth204 | Vth303=Vth304 | Ids203>Ids204 | Ids303=Ids304 |
| ④ | Vth203=Vth204 | Vth303=Vth304 | Ids203=Ids204 | Ids303<Ids304 |

DRIVING CIRCUIT FOR DISPLAY DEVICE

FIELD OF THE INVENTION

This invention relates to a driving circuit for driving a capacitive load within a preset driving period to a target voltage. More particularly, it relates to a driving circuit which may be used with advantage for a driver (buffer) as an output stage of a driving circuit of a display device employing an active matrix driving system.

BACKGROUND OF THE INVENTION

In recent years, in keeping with development of the information communication technique, there is an increasing demand for a portable device having a display unit, such as a mobile phone or a mobile information terminal. In portable devices, the sufficiently long continuous use time is of primary importance. Since the liquid crystal display device is of low power dissipation, it is widely used as a display unit for portable devices. Up to now, the liquid crystal display device was a transmitting type employing a backlight. A reflection type which does not use the backlight and which uses extraneous light has also been developed to achieve further power saving. Recently, with the tendency towards high definition display, clear picture display is required of the liquid crystal display device, such that a demand for a liquid crystal display device of an active matrix driving system, capable of clearer picture display than is possible with the conventional simple matrix system, is increasing. The demand for low power dissipation, which is made for the liquid crystal display device, is also made for its driving circuit, and researches and development of the driving circuit with low power dissipation are now going on briskly. The driving circuit for the liquid crystal display device of the active matrix driving system is hereinafter explained.

In general, the display unit of the liquid crystal display device, employing the active matrix driving system, is made up by a semiconductor substrate, including transparent pixel electrodes and thin film transistors TFTs, a counter substrate, including a sole transparent electrode over its entire surface, and the liquid crystal arranged intermediate the two substrates. A preset voltage is applied to the pixel electrodes, by controlling the TFTs, having the switching functions. The transmittance of the liquid crystal is changed by the potential difference between the pixel electrodes and the counter substrate electrode. The capacitive liquid crystal holds the potential and the transmittance for a preset time period to display the picture.

On the semiconductor substrate, there are arranged data lines for supplying plural level voltages (grayscale voltages) to be applied to the respective pixel electrodes, and scanning lines for supplying switching control signals for TFTs. The data lines operate as capacitive loads due to the capacitance of the liquid crystal sandwiched between the pixel electrodes and the counter substrate electrode and to the capacitance generated in the intersections with the respective scanning lines.

FIG. 12 schematically shows a circuit structure of a conventional typical active matrix type liquid crystal display device. Although plural pixels are provided in the display unit, only an equivalent circuit for a sole pixel is shown in FIG. 12 for simplicity. Referring to FIG. 12, one pixel is made up by a gate line 811, a data line 812, a TFT 814, a pixel electrode 815, a liquid crystal capacitance 816 and a common (counter) electrode 817. The gate line 811 is driven by a gate line driving circuit 802, while the data line 812 is driven by a data line driving circuit 803. The gate line 811 is connected in common to plural pixels forming a pixel row, while the data line 812 is connected in common to plural pixels forming a pixel column. The gate line 811 forms gate electrodes of plural TFTs of a pixel row, and the data line 812 is connected to drains or sources of plural TFTs of a pixel column. The source or drain of the TFT of a pixel is connected to a pixel electrode 815.

The grayscale voltage to the respective pixel electrodes is applied via the data line, and the grayscale voltage is written in the totality of pixels connected to the data line during one frame period (approximately 1/60 sec). Thus, the data line driving circuit has to drive the data line, as the capacitive load, with a high speed to high voltage accuracy.

That is, the data line driving circuit has to drive the data line, as the capacitive load, with a high speed, to high voltage accuracy, and is required to achieve low power dissipation for application to a portable device. As a conventional driving line driving circuit, satisfying these needs, there has been proposed a driving circuit shown for example in FIG. 13 (see for example the Patent document 1).

[Patent Document 1]

Japanese Patent Kokai Publication JP-P2002-055659A (pages 8 to 10 and FIG. 2)

Referring to FIG. 13, this driving circuit is comprised of a preliminary charging/discharging circuit 920 and an output circuit 910. The preliminary charging/discharging circuit 920 includes a first output stage 930, having a first constant current circuit 932, performing a discharging operation, and a charging means 931, and a second output stage 940, having a second constant current circuit 942, performing a charging operation, and a discharging means 941. The charging means 931 and the discharging means 941 receive outputs of a first differential circuit 921 and a second differential circuit 922, respectively. In the driving circuit shown in FIG. 13, in driving the data line to a target voltage, the preliminary charging/discharging circuit 920 serves for driving the data line to close to the target voltage, after which the output circuit 910 drives the data line to a high accuracy.

The driving circuit shown in FIG. 13 is featured by not providing a phase compensation capacitor in order to achieve high-speed operation and low power dissipation in the preliminary charging/discharging circuit 920 of a feedback amplifier circuit. Thus, the differential circuits 921, 922 of the preliminary charging/discharging circuit 920, the first output stage 930 and the second output stage 940 are provided with respective constant current circuits, which constant current circuits control the idling current of the preliminary charging/discharging circuit 920 with the respective constant current circuits for setting the current to sufficiently small values to achieve low power dissipation. Although oscillation is liable to be produced by not providing the phase compensating capacitor, the first output stage 930 and the second output stage 940 are controlled so that, if one of the circuits is in operation, the other circuit is not in operation, with the current of the first constant current circuit 932 and the current of the second constant current circuit 942 being set to sufficiently small values to suppress oscillations to stabilize the output. Moreover, the driving circuit shown in FIG. 13 is able to operate with a high speed, with a sufficiently small idling current, by not providing the phase compensation capacitor. Moreover, if, in the driving circuit of FIG. 13, the operations of the first output stage 930 and the second output stage 940 are performed in one data period, the dynamic range can be extended to the power supply voltage range. Such extension of the dynamic range to within the power supply voltage range is equivalent to reducing the power supply voltage range, and represents efficacious means for reducing the power consumption. Thus, various other driving circuits have so far been proposed. A driving circuit shown for example in FIG. 14 has been proposed as an area saving driving circuit of a simpler structure (see for example the Patent document 2).

[Patent Document 2]

Japanese Patent Kokai Publication JP-A-9-130171 (page 10, FIG. 5)

FIG. 14 shows a circuit configuration of an operational amplifier combined from amplifier circuits 620 and 630. Each of the amplifier circuits 620 and 630 each differentially amplifies the differential input voltage between the first and second input terminals. In FIG. 14, these amplifier circuits are shown as being of a non-inverting amplifying type voltage follower configuration for current-amplifying the input voltage Vin to output the resulting signal to an output terminal 2.

The amplifier circuit 620 is of such a structure in which p-channel current mirror circuits 621, 622 are connected as load circuits to output pairs of n-channel differential pair 623, 624, a differential portion of which is driven by a transistor 625 operating as a current source. An output stage of the amplifier circuit 620 is made up by a p-channel transistor 641, connected across the high potential power supply VDD and an output terminal 2 and a load 642 connected across a low potential power supply VSS and the output terminal 2. A connection node of the drain of the transistor 621 as an output end of the differential section and the drain of the transistor 623 is connected to the gate terminal of a p-channel transistor 641. The gate terminals of the n-channel differential pairs 623, 624 form non-inverting input ends and inverting input ends, respectively. The gate terminals of the n-channel differential pair 623, 624 are connected to an input terminal 1 and an output terminal 2. The transistor 625 and the load 642 are supplied with a bias voltage VF1.

The amplifier circuit 630 is of such a structure in which n-channel current mirror circuits 631, 632 are connected as load circuits to output pairs of p-channel differential pair 633, 634, a differential portion of which is driven by a transistor 635 operating as a current source. An output stage of the amplifier circuit 630 is made up by a n-channel transistor 651, connected across the low potential power supply VSS and the output terminal 2, and a load 652, connected across a high potential power supply VDD and the output terminal 2. A connection node of the drain of the transistor 631 as an output end of the differential section and the drain of the transistor 633 is connected to the gate terminal of a n-channel transistor 651. The gate terminals of the p-channel differential pairs 633, 634 form non-inverting input ends and inverting input ends, respectively. The gate terminals of the n-channel differential pair 633, 634 are connected to the input terminal 1 and the output terminal 2. The transistor 635 and the load 652 are supplied with a bias voltage VF2.

In an operational amplifier, shown in FIG. 14, the loads 642, 652 operate as loads having a preset resistance value, whereby the dynamic range is enlarged to within the power supply voltage range. Specifically, when the input voltage Vin is in the vicinity of the low potential power supply VSS in which the n-channel differential pairs 623, 624 are not in operation, the load 652 forms a current path across the high potential power supply VDD and the output terminal 2, so that the output terminal is driven to the voltage Vin by the operation of the amplifier circuit 630. When the input voltage Vin is in the vicinity of the high potential power supply VDD in which the p-channel differential pairs 633, 634 are not in operation, the load 642 forms a current path across the low potential power supply VSS and the output terminal 2, so that the output voltage is driven to the voltage Vin by the operation of the amplifier circuit 620.

When the input voltage Vin is in a voltage range for which both the n-channel differential pairs 623, 624 and the p-channel differential pairs 633, 634 are in operation, both the amplifier circuits 620, 630 are in operation to drive the output terminal to the voltage Vin. The operational amplifier shown in FIG. 14 enlarges the operating range to within the power supply voltage range, under the operating principle described above.

As the technique relevant to the present invention, there is known a differential amplifier used as a power supply circuit, as shown in FIG. 15 (see for example the Patent document 3).

[Patent Document 3]

Japanese Patent Kokai Publication JP-P2001-284988A (page 7, FIG. 2)

The amplifier circuit shown in FIG. 15 is a voltage follower circuit, similar to the circuit shown in FIG. 14, and is a differential amplifier combined from an amplifier circuit 720 and an amplifier circuit 730.

The amplifier circuit 720 is of such a structure in which p-channel current mirror circuits 721, 722 are connected as load circuits to output pairs of n-channel differential pair 723, 724, a differential portion of which is driven by a constant current source 725. An output stage of the amplifier circuit 720 is made up by a p-channel transistor 711, connected across the high potential power supply VDD and the output terminal 2. A connection node of the drain of the transistor 721 as an output end of the differential section and the drain of the transistor 723 is connected to the gate terminal of a p-channel transistor 711. The gate terminals of the n-channel differential pairs 723, 724 form non-inverting input ends and inverting input ends, respectively. The gate terminal of the transistor 723 is connected to the output terminal 1, while the gate terminal of the transistor 724 is connected to the output terminal 2 via a resistor R1. A capacitance C1 is connected across the gate terminals of the transistors 724, 711.

The amplifier circuit 730 is of such a configuration in which a differential section which includes p-channel differential pair 733, 734, which is driven by a constant current source 735, and n-channel current mirror circuits 731, 732 connected as load circuits to output pairs of the p-channel differential pair 733, 734. An output stage of the amplifier circuit 730 is made up by an n-channel transistor 712, which is connected across the low potential power supply VSS and the output terminal 2. A connection node of the drain of the transistor 731 as an output node of the differential section and the drain of the transistor 733 is connected to the gate terminal of an n-channel transistor 712. The gate terminals of the p-channel differential pairs 733, 734 form non-inverting input and inverting input nodes, respectively. The gate terminal of the transistor 733 is connected to the output terminal 1, while the gate terminal of the transistor 734 is connected to the output terminal 2 via a resistor R2. A capacitance C2 is connected across the gate terminals of transistors 734, 712. The capacitors C1 and C2 of the amplifier circuits 720 and 730 and the resistors R1 and R2 are provided for phase compensation in order to stabilize the outputs of the amplifier circuits 720 and 730.

The feature of the differential amplifier shown in FIG. 15 is that the transistor pairs 723, 724 as differential pair or the transistors 733, 734 as differential pair are designed to differential capabilities such that the amplifier circuits 720 and 730 have output offsets relative to the input voltage Vin. The amplifiers are used as power supply circuits outputting the voltage Vin within the setting range of the output offset. Specifically, the device size (channel width or the gate length) between transistors forming the differential pair are changed to provide differential drain currents of the transistors of the differential pair and differential gate-to-source voltage to generate an output offset. A common input voltage VIN is applied to the amplifier circuits 720 and 730 of the differential amplifier circuit to provide for differential capabilities for the transistor pair forming the amplifier circuits 720 and 730 of the differential amplifier circuit, such that the amplifier circuits 720 of the differential amplifier circuit operates so that the first output voltage VOUT1 acts as the output voltage VOUT, and such that the amplifier circuit 730 of the differential amplifier circuit operates so that the second output voltage VOUT2 acts as the output voltage VOUT. That is, when the output offset of the amplifier circuit 720 is set so as to be positive against the voltage Vin and the output offset of the amplifier circuit 730 is set so as to be negative against the voltage Vin, the short-circuit current flowing in the transistors 711, 712 is decreased to constitute the lower supply circuit of low power dissipation.

SUMMARY OF THE DISCLOSURE

However, in the driving circuit shown in FIG. 13, the first output stage 930 and the second output stage 940 manage control so that, when one of them is in operation, the other is not in operation, so that, for driving the word line to a target voltage, the preliminary charging/discharging period has to be divided in two stages, that is, a preliminary charging period of actuating the first output stage 930 and another preliminary charging period of actuating the second output stage 940. The result is that the time of driving to close to the target voltage for the charging operation differs from that for the discharging operation. FIG. 16 shows an example thereof.

FIG. 16 shows, in an output voltage waveform diagram of the driving circuit of FIG. 13, a waveform of driving from Vin2 to Vin1 and the waveform (voltage waveform 2) in driving from Vin1 to Vin2.

As may be seen from FIG. 16, the voltage waveform 1 is driven promptly to close to the target voltage (Vin1), when the preliminary charging period for operating the first output stage 930 commences directly after start of the driving period. However, the voltage waveform 2 is not changed in voltage during the preliminary charging period, but is driven to close to the target voltage (Vin2) with start of the preliminary discharging period actuating the second output stage 940. That is, in the exemplary case of FIG. 16, the voltage waveform 2 is driven to close to the target voltage with a delay equal to the preliminary charging period as compared to the voltage waveform 1.

In recent years, the liquid crystal display device for portable or mobile equipment tends to be improved in resolution and in image format size and, in keeping therewith, the data line capacitance increases, while the one data-driving period is becoming shorter. In case the TFT of the display unit is amorphous silicon TFT, the charge mobility of TFT is low, so that some time must elapse until the TFT is turned on and the voltage introduced to the data line is written in the pixel electrode. Thus, for clear display, it is necessary to drive the pixel electrode to the target voltage within one data driving period. For this reason, the data line needs to be driven to the vicinity of the target voltage as quickly as possible as from the start of the one data driving period.

It is seen from above that, in the driving circuit in which preliminary charging/discharging driving needs to be performed in two stages, as shown in FIG. 13, in order to cope with the increase in the picture size or with the improved resolution in the liquid crystal display device, the preliminary charging period and the preliminary discharging period need to be longer, such that driving the data line to the vicinity of the target voltage is time-consuming and hence writing in the pixel electrodes cannot be achieved sufficiently.

On the other hand, if the operational amplifier shown in FIG. 14 is used as a driving circuit for the liquid crystal display device for portable equipment, the circuit structure is simple, while the dynamic range is equal to the range of the power supply voltage. Moreover, the surface area is saved and the power consumption is lower. However, in the voltage range of the input voltage Vin is such a voltage range in which both the n-channel differential pair 623, 624 and the p-channel differential pair 633, 634 are in operation, the high charging capability of the amplifier circuit 620 and the high discharging capability of the amplifier circuit 630 may be in operation, so that oscillation occurs readily in the absence of phase compensation means. In actual circuits, such as in a feedback structure shown for example in FIG. 14, there is a response delay until changes in the output voltage are transmitted to the input, due to, for example, parasitic capacitance of the circuit components. The result is that overshoot or undershoot is readily produced, such that, in an amplifier circuit or a feedback amplifier circuit of a high driving capability, oscillations readily occur unless there is provided a phase compensation capacitance of a sufficient capacitance value. Moreover, in a routine operational amplifier, the transistors of both the n-channel differential pair 623, 624 and the p-channel differential pair 633, 634 are formed by devices of the same characteristics.

In actual circuits, the characteristics of the transistors, forming the differential pair, tends to be offset only slightly, thus leading to oscillations. For this reason, the phase compensation capacitance is usually provided. However, in case such phase compensation capacitance is provided, a sufficient idling current is needed for prompt charging/discharging of the phase compensation capacitance for achieving prompt driving. Thus, in case the phase compensation capacitance is provided, the power consumption is increased.

The case in which the differential amplifier such as is shown in FIG. 15 is used in a driving circuit for a liquid crystal display device for portable equipment is now explained. The differential amplifier circuit, such as is shown in FIG. 15, suffers from the drawback that the circuit operates only in a range in which both the differential pair 723, 724 and the differential pair 733, 734 may be in operation, and hence the circuit has only a narrow dynamic range with respect to the voltage range of the power supply with the result that power consumption is increased if a dynamic range of a preset range is to be achieved.

The dynamic range of the differential amplifier circuit, such as is shown in FIG. 15, may be increased to within the voltage range of the power supply by providing a load having a preset resistance value, such as loads 642, 652 shown in FIG. 14. This solution, however, suffers from the drawback that correct driving cannot be achieved since the differential amplifier circuit shown in FIG. 15 is of such a structure in which an output offset is necessarily produced in one of the amplifier circuits 720, 730 with respect to the input voltage Vin. More specifically, when the input voltage Vin to the differential amplifier circuit shown in FIG. 15 is close to the voltage of the low potential power supply VSS for which the n-channel differential pair 723, 724 is not in operation or when the input voltage Vin is close to the voltage of the high potential power supply VDD for which the p-channel differential pair 733, 734 is not in operation, the output terminal 2 needs to be driven to the voltage Vin by the operation of only one of the amplifier circuits 720, 730. That is, the differential amplifier circuit shown in FIG. 15 suffers from the problem that driving to high accuracy cannot be achieved in an area where only one of the amplifier circuits susceptible to output offset is in operation.

Accordingly, it is an object of the present invention to provide a driving circuit of a broad dynamic range capable of driving a capacitive load promptly to a target voltage and of achieving low power dissipation, high accuracy output and saving in a circuit area.

The above and other objects are attained by a driving circuit in accordance with one aspect of the present invention, which comprises a first transistor amplifier and a first current source, arranged in parallel with each other across an output terminal and a high potential power supply for charging the output terminal, a second transistor amplifier and a second current source, arranged in parallel with each other across the output terminal and a low potential power supply for discharging the output terminal, and switching control means operating, in case a driving period for driving the output terminal to a target voltage is made up by at least a first period and a second period, for performing control so that, in the first period, both of the first and second transistor amplifiers activated, and in the second period, one of the first transistor amplifier and the second transistor amplifier is activated, with the other transistor amplifier being inactivated. By this configuration, according to the preset invention, the output voltage may promptly be driven to the target voltage with low power dissipation even in the configuration not provided with the phase compensation capacitance. The dynamic range equivalent to the power supply voltage range may also be realized.

According to the present invention, the first setting drive voltage, realized by charging by the first transistor amplifier during the first period, is lower than the second setting drive voltage, realized by discharging by the second transistor amplifier. With this configuration, according to the present invention, the buffer area, in which neither the first transistor amplifier nor the second transistor amplifier is in operation, is provided in the vicinity of the target voltage. This buffer area suppresses overshoot or undershoot in driving the output voltage to the target voltage and operates as a substitute for a phase compensation capacitor element.

Moreover, according to the present invention, the current source, arranged parallel to the other transistor amplifier being inactivated, is activated during the second period.

The driving circuit according to the present invention, as a circuit configuration in which the first setting drive voltage, realized by charging by the first transistor amplifier, is set lower than the second setting drive voltage, realized by charging by the second transistor amplifier, comprises a first differential circuit including a first differential pair, supplied with input signal voltages from a non-inverting input terminal and an inverting input terminal, as differential inputs, an output of the first differential pair being supplied to a control terminal of the first transistor amplifier, and a second differential circuit including a second differential pair, supplied with input signal voltages from a non-inverting input terminal and an inverting input terminal, as differential inputs, an output of the second differential pair being supplied to a control terminal of the second transistor amplifier. At least one of the first differential pair and the second differential pair may be formed by a transistor pair with different threshold voltages.

In addition, the driving circuit according to the present invention, as a circuit configuration in which the first setting drive voltage, realized by charging by the first transistor amplifier, is set lower than the second setting drive voltage, realized by charging by the second transistor amplifier, comprises a first differential circuit including a first differential pair, supplied with input signal voltages from a non-inverting input terminal and an inverting input terminal, as differential inputs, an output of the first differential pair being supplied to a control terminal of the first transistor amplifier, a second differential circuit including a second differential pair, supplied with input signal voltages from a non-inverting input terminal and an inverting input terminal, as differential inputs, and control means. An output of the second differential pair is supplied to a control terminal of the second transistor amplifier. One transistor of a transistor pair forming at least one of the first and second differential pairs is a plurality of transistors connected parallel to one another and having respective different threshold voltages or respective different current driving capabilities. The control means manages control to activate at least one of the plural transistors.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 shows the control of activation/inactivation according to an embodiment of the present invention.

FIG. 5 shows the setting of transistors forming a differential pair of the first embodiment of the present invention.

PREFERRED EMBODIMENTS OF THE INVENTION

Preferred embodiments of the invention are described in the below. The principle and the operation of the driving circuit of the present invention are hereinafter described. In the following embodiment, the present invention is applied to a driving circuit in which a capacitive load, such as a data line of a liquid crystal display device, is driven to a target voltage within a preset time, as hereinafter explained with reference to the drawings.

The present invention is directed to a driving circuit not having a phase compensation capacitance or having only a sufficiently small phase compensation capacitance, for achieving low power dissipation and a high-speed operation. In the present embodiment, the structure and the control for suppressing the oscillations and for realizing a high-speed operation, and the operation as well as the meritorious effect, resulting therefrom, are explained.

Figure 1:
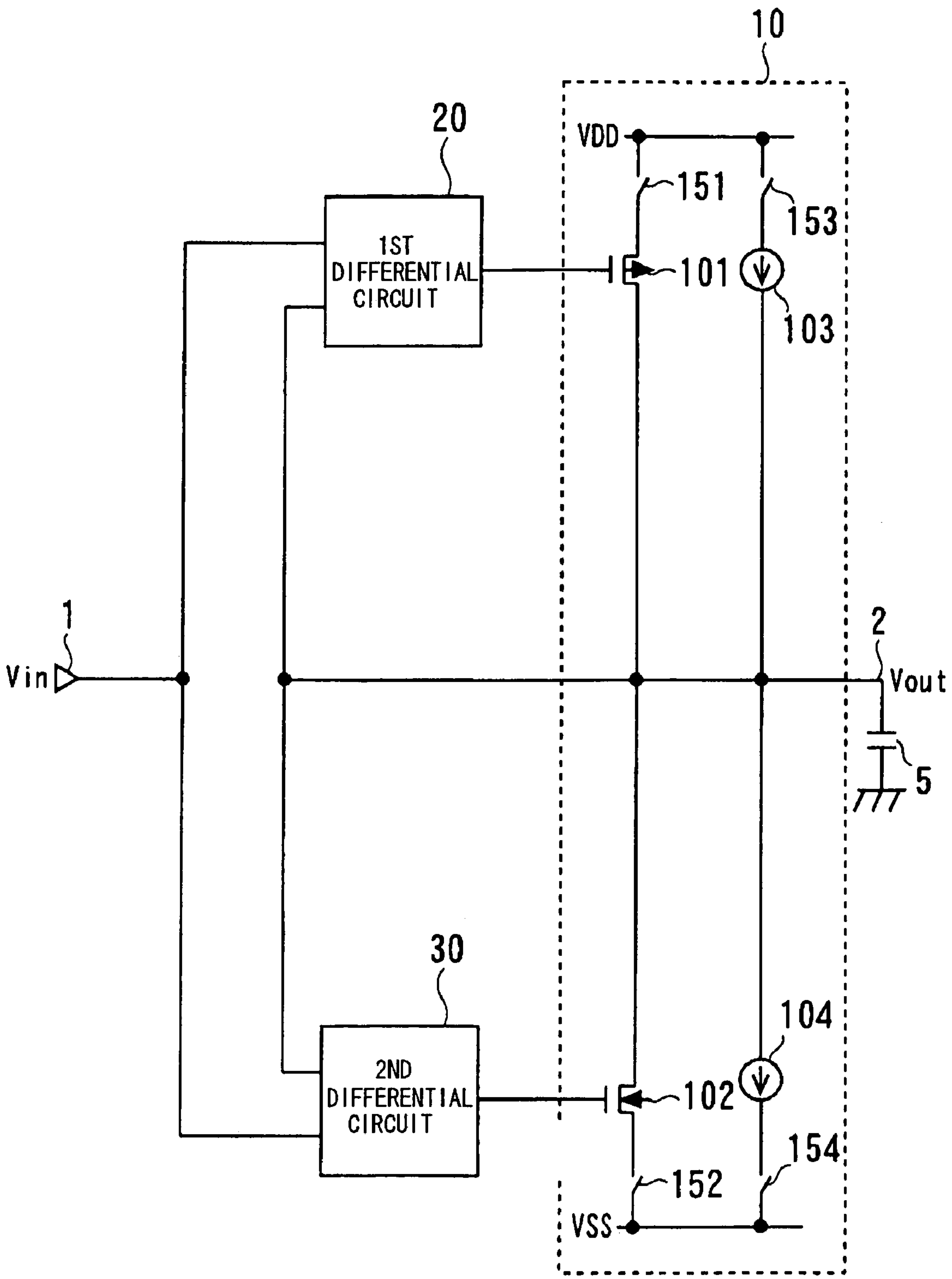
FIG. 1 shows the configuration of an embodiment of the present invention.

FIG. 1 shows the configuration of a first embodiment of a driving circuit according to the present invention. In the driving circuit, shown in FIG. 1, a circuit 10 represents a basic structure according to the present invention. In this circuit 10, a p-channel transistor 101 and a switch 151, responsible for charge driving an output terminal 2, is connected in series across the output terminal 2 and a high potential power supply VDD and, in parallel with the series circuit of the transistor 101 and the switch 151, a constant current source 103 and a switch 153 are connected in series across the output terminal 2 and the high potential power supply VDD. An n-channel transistor 102 and a switch 152, responsible for discharge driving the output terminal 2, is connected in series across the output terminal 2 and a low potential power supply VSS and, in parallel with the series circuit of the transistor 102 and the switch 152, a constant current source 104 and a switch 154 are connected in series across the output terminal 2 and the low potential power supply VSS.

In the circuit structure, shown in FIG. 1, there are provided a first differential circuit 20 and a second differential circuit 30, as a circuit responsible for operational control of the p-channel transistor 101 and an n-channel transistor 102.

The first differential circuit 20 has, as differential inputs, an input voltage Vin at an input terminal 1, and an output terminal Vout at the output terminal 2. An output of the first differential circuit 20 is supplied to a control terminal (gate terminal) of the p-channel transistor 101.

The second differential circuit 30 has an input voltage Vin and an output voltage Vout as a differential input. An output of the second differential circuit 30 is supplied to a control terminal of the n-channel transistor 102. That is, the first differential circuit 20 and the p-channel transistor 101 form a feedback type amplifier circuit for charging the output terminal 2, while the second differential circuit 30 and the n-channel transistor 102 form a feedback type amplifier circuit for discharging the output terminal 2.

At the output terminal 2, a voltage which is in keeping with the input voltage Vin is output as an output voltage Vout.

Plural switches 151 to 154 control the active or inactive state of the p-channel transistor 101, n-channel transistor 102 and the constant current sources 103, 104, connected to one ends thereof, such that, when the relevant switches are on and off, the transistors and the constant current sources are activated (in operation) and inactivated (not in operation), respectively.

It should be noted that the active state or the inactive state of the p-channel transistor 101, n-channel transistor 102 and the constant current sources 103, 104 may be controlled by other than the switches connected in the series circuit configuration.

In a one-data driving period for driving the output terminal 2 to a target voltage, there are provided a first period when both the p-channel transistor 101 and the n-channel transistor 102 are activated and a second period when one of the p-channel transistor 101 and the n-channel transistor 102 is activated, with the other being in the inactivated state.

In the second period, the constant current source, connected parallel to the inactivated transistor, is activated.

Thus, with start of the first period, the p-channel transistor 101 or the n-channel transistor 102 is in operation, while the output terminal is promptly driven to a voltage which is in keeping with the input voltage Vin. By setting the input voltage Vin in keeping with the target voltage, it is possible to drive the load to the target voltage to high accuracy during the second period.

More specifically, the circuit 10 is controlled in a manner shown as a list in FIG. 2. In this figure, the state of control to the activated state or to the inactivated state of the p-channel transistor 101, n-channel transistor 102 and the constant current sources 103, 104 during the data driving period is shown in a tabulated form.

There are two sorts of control in one data driving period for driving the load to the target voltage, indicated by a first data driving period and a second data driving period. In the first period of each data driving period, both the p-channel transistor 101 and the n-channel transistor 102 are activated, while the output terminal 2 is promptly driven to the voltage which is in keeping with the input voltage Vin.

If, at this time, the currents of the constant current sources 103 and 104 are set to a sufficiently small value, the constant current sources 103 and 104 may be in the activated or in the inactivated state, because the driving capability of the constant current sources is small. However, the constant current sources 103 and 104 are desirably controlled to the inactivated state in order to suppress the power dissipation.

The control during the second period differs in the first and second data driving periods. In the second period of the first data driving period, the p-channel transistor 101 and the constant current source 104 are activated, while the n-channel transistor 102 and the constant current source 103 are inactivated.

In the second period of the second data driving period, the p-channel transistor 101 and the constant current source 104 are inactivated, while the n-channel transistor 102 and the constant current source 103 are activated. That is, during the second period, the transistor amplifier, performing the charge driving or the discharge driving, and the constant current source, performing the reverse driving, are activated. By setting the constant current source to a sufficiently small current, low power dissipation may be achieved simultaneously with output stabilization. Moreover, by selecting optimum control of the first driving period or the second driving period, depending on the target voltage, the circuit 10 may be in operation in the entire voltage range of the power supply voltage. Thus, the driving circuit of the present invention may have a dynamic range equivalent to the voltage range of the power supply voltage.

Meanwhile, the operation of output stabilization during the second period takes advantage of the principle that, if the capability of one of the charging and the discharge is lowered, the operation of the charging or the discharge, the capability of which has been lowered, is slowed down, thus suppressing the oscillations.

According to the present invention, the operation of both the p-channel transistor 101 and the n-channel transistor 102 is enabled during the first period of the one-data driving period.

Figure 13:
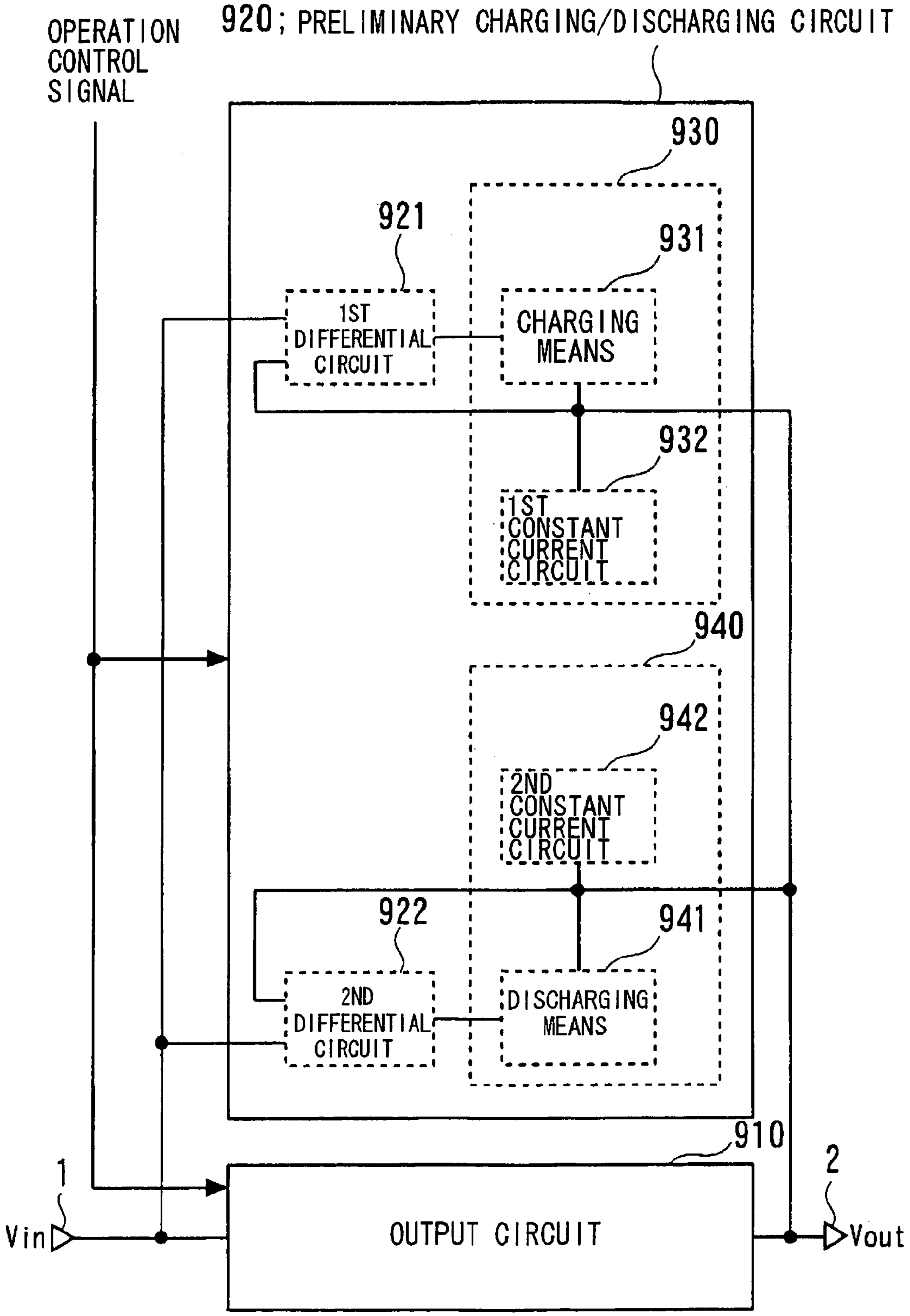
FIG . 13 PRIOR ART
FIG. 13 shows the configuration of a conventional amplifier circuit.
Figure 14:
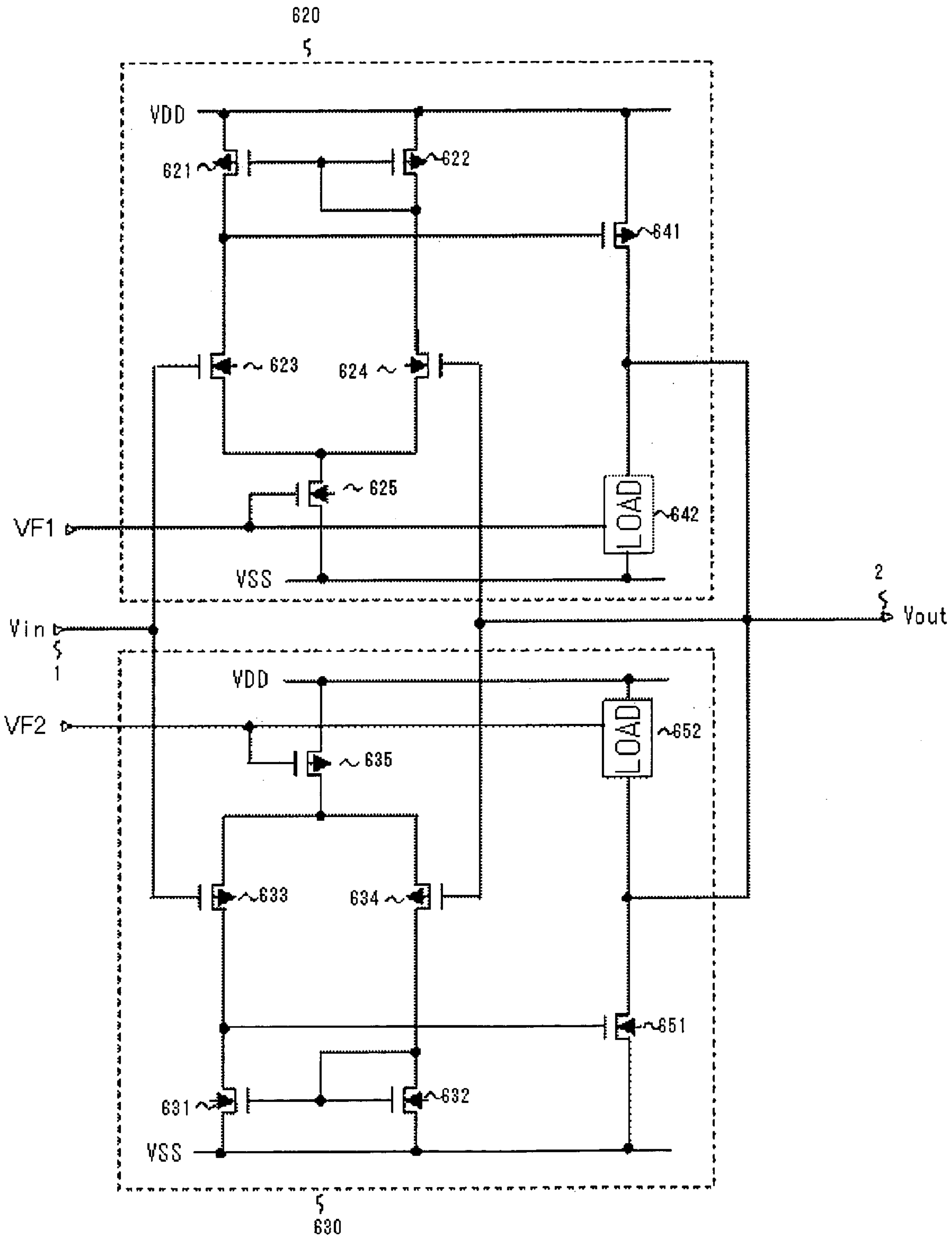
FIG .14 PRIOR ART
FIG. 14 shows the configuration of a conventional amplifier circuit.
Figure 16:
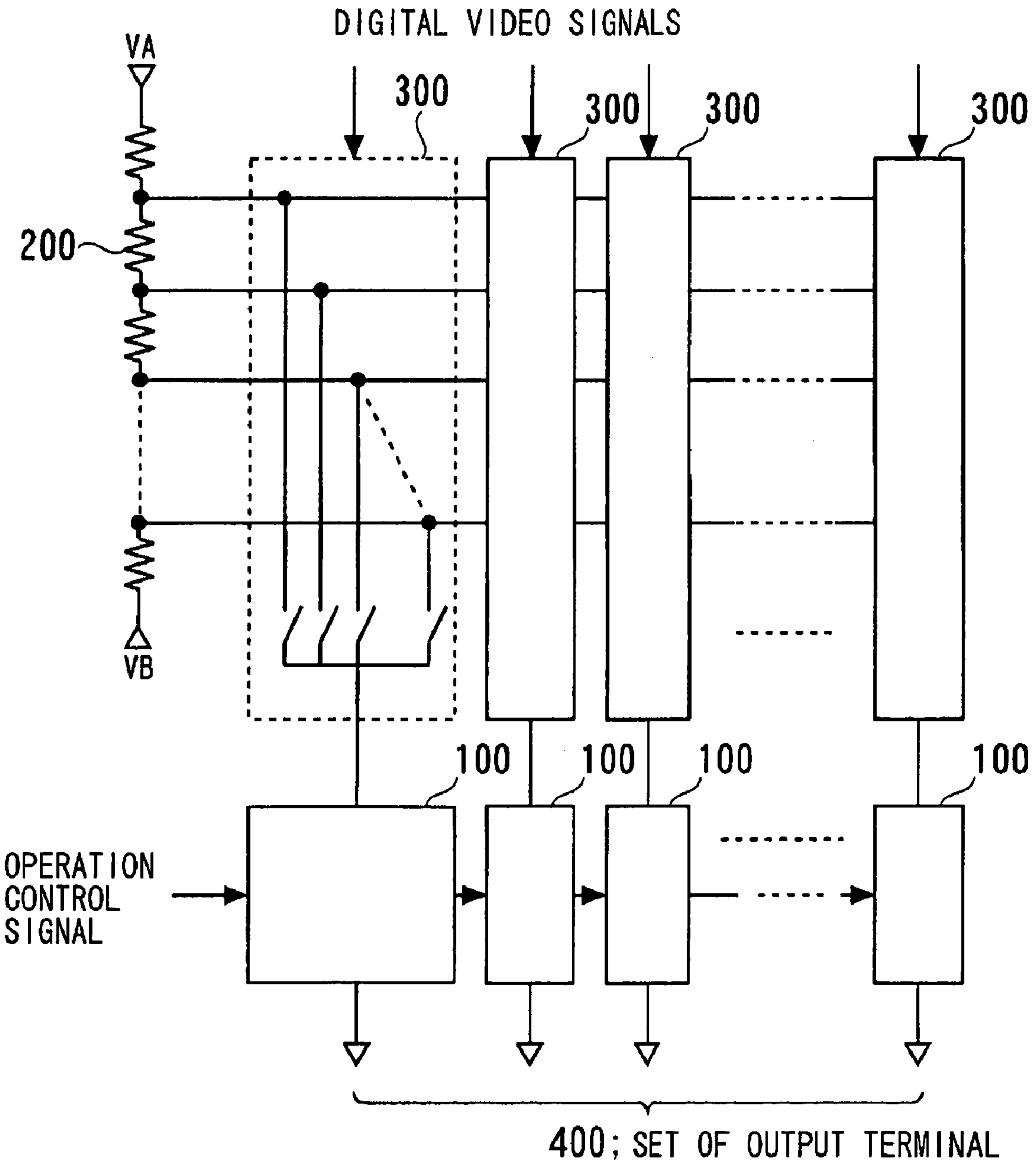
FIG. 16 PRIOR ART
FIG. 16 illustrates the operation of a conventional amplifier circuit.

In the structure shown in the Patent document 1, severe oscillations may be produced in case the operation of charging means 931 and discharging means 941 of FIG. 13 is enabled simultaneously. Thus, the preliminary charging/discharge period is divided in two stages, as shown in FIG. 16, so that the charging means 931 and the discharging means 941 are not in operation simultaneously.

Conversely, according to the present invention, control is managed so that a first setting drive voltage V1, produced by charging with respect to the input voltage Vin by the p-channel transistor 101, is lower than a second setting drive voltage V2, produced by discharging with respect to the input voltage Vin by the n-channel transistor 102. Thus, a buffer (transition) area, in which neither the transistor amplifier 101 nor the transistor amplifier 102 is in operation, is provided in the vicinity of the target voltage, and plays the role of suppressing overshoot or undershoot when the output terminal 2 is driven to the target voltage, in order to serve as a substitute for the phase compensation capacitance. Thus, oscillations may be prohibited form occurring even in case the operation of the p-channel transistor 101 and the n-channel transistor 102 is enabled simultaneously during the first period.

Figure 3A:
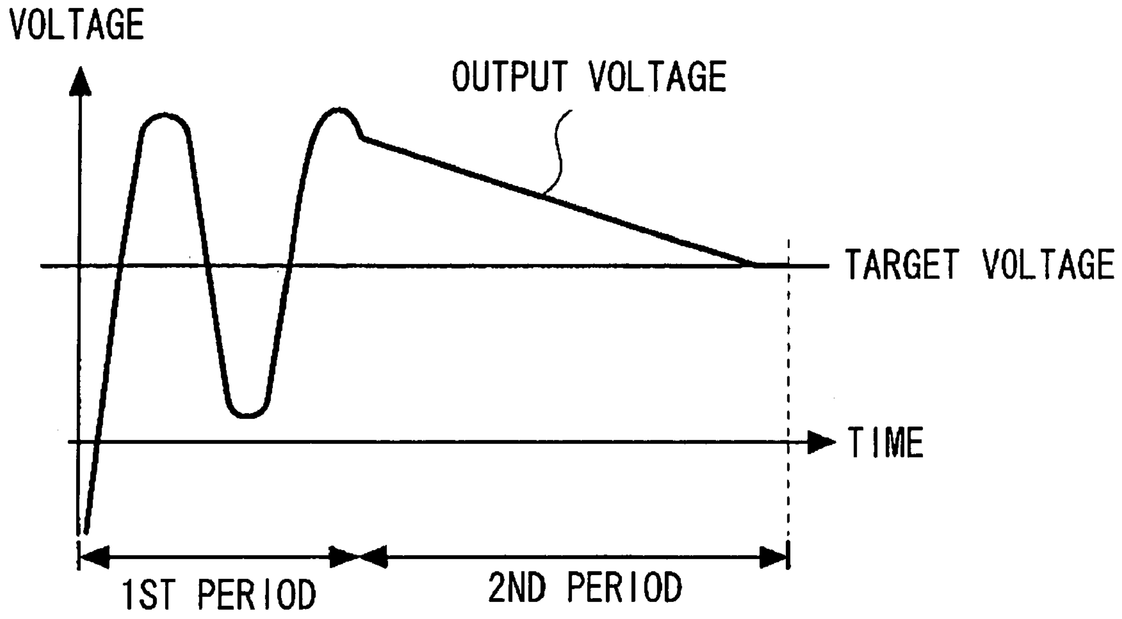
FIGS. 3A and 3B illustrate the operation of an embodiment of the present invention.
Figure 3B:
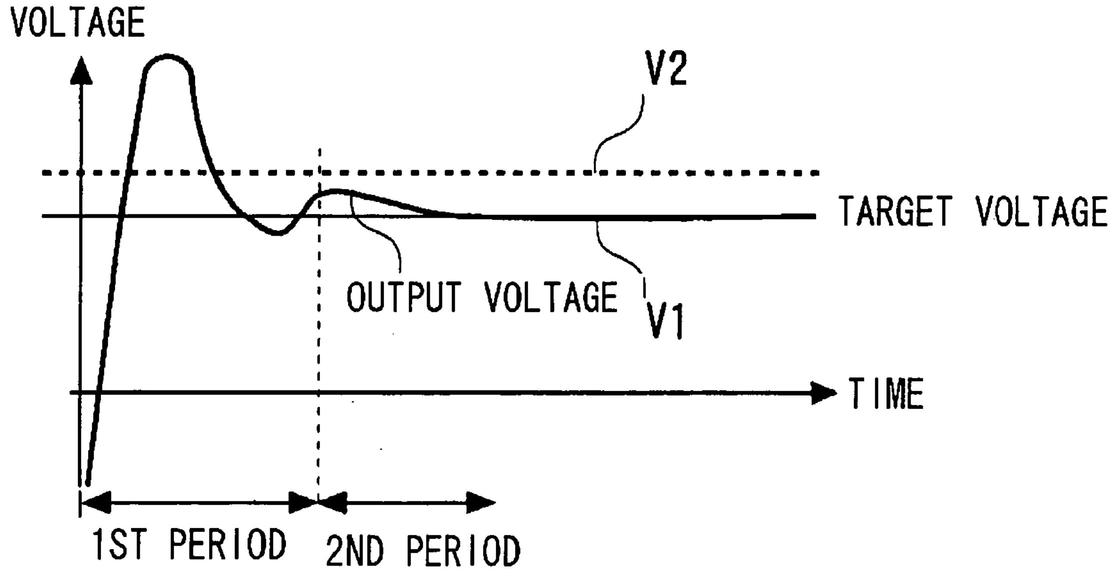

The operation and effect of the above-described control in the present invention are now explained by referring to the voltage waveform diagram shown in FIG. 3. This figure shows the output voltage waveform when the low potential output terminal is driven to a high potential target voltage (target voltage) by the control during the first data driving period of FIG. 2. FIG. 3A shows a comparative example for comparison with the present invention, and specifically shows a case where the setting drive voltage of each of the p-channel transistor 101 and the n-channel transistor 102 is equal to the target voltage. FIG. 3B shows an output voltage waveform of the first embodiment explained with reference to FIGS. 1 and 2 and specifically shows a case where the setting drive voltage V1 of the p-channel transistor 101 is lower than the setting drive voltage V2 of the n-channel transistor 102.

First, the operation in FIG. 3A is explained. In the embodiment shown in FIG. 3A, the p-channel transistor 101 is able to charge the low potential output terminal to a target voltage, while the n-channel transistor 102 may be charged to the target voltage. In the embodiment shown in FIG. 3A, the output terminal voltage is in the low potential state at the time of the beginning of the first period. Thus, the output terminal voltage is raised by charging to the target voltage by the p-channel transistor 101. However, in actual circuits, such as a circuit of the feedback configuration shown in FIG. 1, there is a response delay until the change in the output voltage is propagated to the input, due to, for example, the parasitic capacitance of the devices making up the circuit, thus frequently producing the overshoot. If the overshoot has occurred, the n-channel transistor 102 is in operation to lower the overshooting output voltage to the target voltage. The undershoot is now produced due to response delay.

This overshoot or the undershoot is severer the higher is the charging capability of the p-channel transistor 101 or the discharging capability of the n-channel transistor 102. In the case of the amplifier circuit or the feedback amplifier circuit of high driving capability, oscillations may occur readily in the absence of the phase compensation capacitance of a sufficiently large capacitance value.

Thus, in FIG. 3A, the output voltage is subjected to severe oscillations, during the first period, about the target voltage as center. FIG. 3A shows an embodiment in which the operation transfers from that of the first period to that of the second period in case the output voltage has been changed appreciably towards the high potential side.

In the second period, the p-channel transistor 101 and the constant current source 104 are activated (enabled), with the n-channel transistor 102 and the constant current source 104 being in inactivated state.

If, during the second period, the output voltage is higher than the target voltage, the p-channel transistor 101 is not in operation, such that the output voltage is lowered to the target voltage by the constant current source 104. If the current of the constant current source 104 at this time is sufficiently small, certain time must elapse until the output voltage reaches the target voltage, such that high-speed driving cannot be achieved.

That is, if the setting drive voltage of the p-channel transistor 101 is equal to that of the n-channel transistor 102, during the first period, severe oscillations may be produced in the output voltage, such that some time must elapse until the output voltage is changed to the target voltage during the second period, as a result of which high speed driving becomes difficult.

In the embodiment shown in FIG. 3B, the setting drive voltage V1 of the p-channel transistor 101 is controlled to a potential lower than the setting drive voltage V2 of the n-channel transistor 102. That is, the p-channel transistor 101 is able to charge the low potential output terminal to the voltage V1, while the n-channel transistor 102 is able to discharge the high potential output terminal to the voltage V2 (V1<V2). Thus, the area between V1 and V2 is a buffer area where neither the p-channel transistor 101 nor the n-channel transistor 102 is in operation. Meanwhile, FIG. 3B shows an embodiment in which the voltage V1 has been set so as to coincide with the desired voltage (target voltage). Of course, not the voltage V1 but the voltage V2 may be set so as to coincide with the target voltage.

In the embodiment shown in FIG. 3B, the output terminal is in the low potential state, at the beginning point of the first period. Thus, the output terminal is charged to the target voltage (=V1) by the p-channel transistor 101. In the feedback configuration, shown in FIG. 1, the output voltage is subjected to overshoot due to response delay. In case the overshoot is produced, the n-channel transistor 102 is now in operation to lower the overshooting output voltage to the voltage V2.

Here again, response delay persists, so that the output voltage is subjected to undershoot. However, this undershoot is turned down in the buffer area between the voltages V1 and V2.

If the output voltage Vout undershoots to a voltage lower than the voltage V1, the charging operation by the p-channel transistor 101 is again started. However, the overshoot becomes weaker in the buffer area between the voltages V1 and V2. The output voltage is ultimately stabilized in the buffer area between the voltages V1 and V2.

Thus, during the second period, the output voltage between V1 and V2 is driven by the discharge operation of the constant current source 104.

By setting the buffer area between the voltages V1 and V2 to a comparatively small value, the output voltage may be lowered promptly to the target voltage, even if the current of the constant current source 104 is sufficiently small.

Thus, in the embodiment shown in FIG. 3B, the operation at a higher speed is possible than in the embodiment shown in FIG. 3A.

According to the present invention, described above, the setting drive voltage V1 of the p-channel transistor 101 is set so as to be lower than the setting drive voltage V2 of the n-channel transistor 102, and the buffer area between the voltages V1 and V2 is set to the minimum voltage capable of promptly suppressing the oscillations, so that, even if the p-channel transistor 101 and the n-channel transistor 102 are operable simultaneously, there is no risk of oscillations, such that the output terminal can be promptly driven to the voltage which is in keeping with the input voltage Vin.

The input voltage Vin is controlled in keeping with the target voltage, whereby the output voltage may be changed in the second period to the target voltage to high accuracy.

That is, according to the present invention, the oscillations may be suppressed by provision of the buffer area, so that, even in the feedback type amplifier circuit configuration, shown in FIG. 1, it is possible to suppress the phase compensation capacitance to a sufficiently small value, or to dispense with the phase compensation capacitance. Thus, the current for high-speed charging/discharging the phase compensation capacitance may be decreased, such that, even if the idling current including those of the constant current sources 103 and 104 is set to a sufficiently small value, the high-speed operation is possible, while power dissipation may be reduced.

Moreover, the phase compensation capacitance, which takes up a comparatively large area in a thin-film transistor integrated circuit, may be of a smaller area, because the capacitance value may be reduced.

For further detailed explanation of the above-described embodiments of the present invention, certain preferred embodiments of the present invention are now explained with reference to the drawings.

[First Embodiment]

Figure 4:
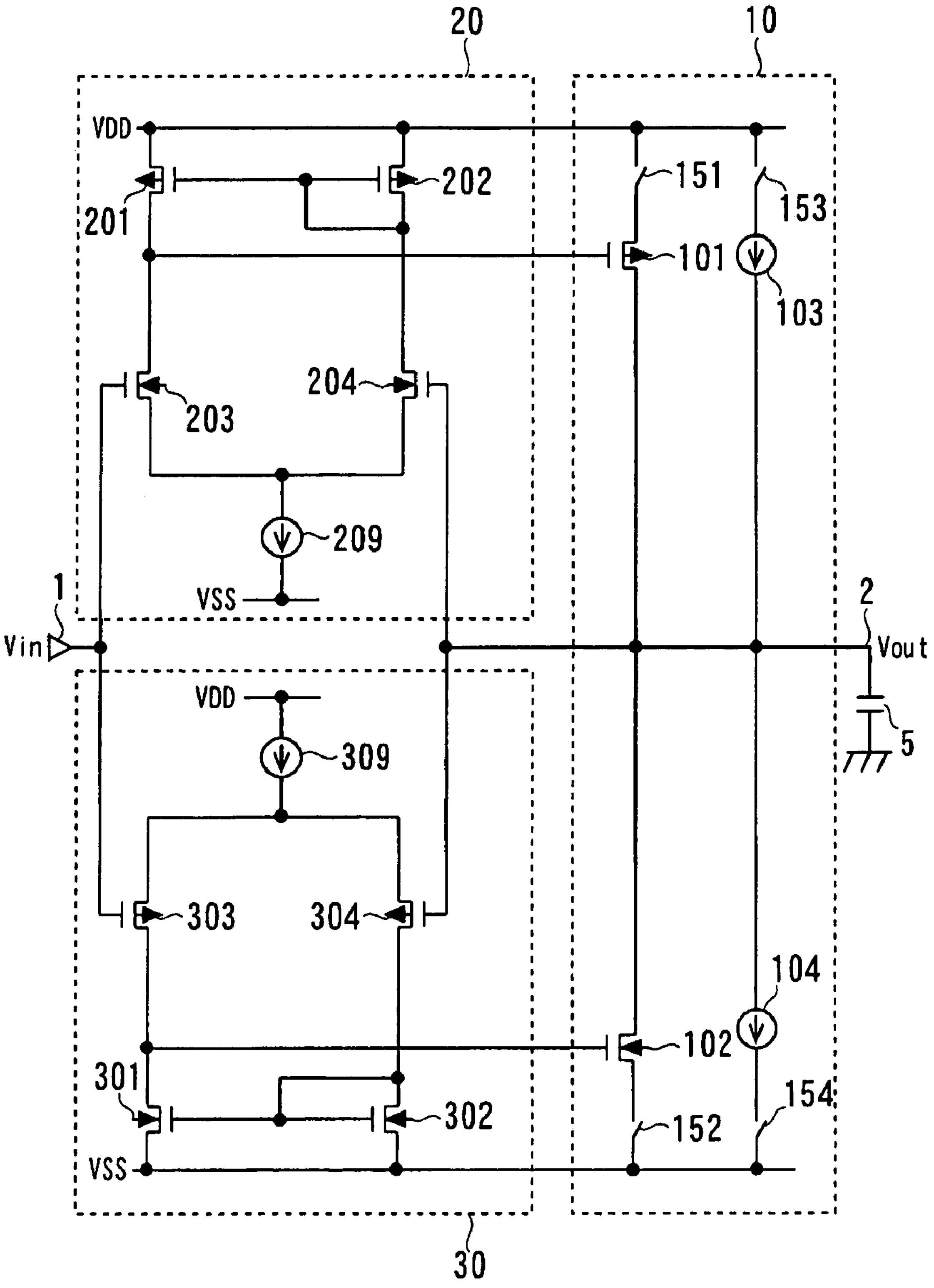
FIG. 4 shows the configuration of a first embodiment of the present invention.

FIG. 4 shows the configuration of a driving circuit of a first embodiment of the present invention, and specifically shows specified examples of the first differential circuit 20 and the second differential circuit 30 in the driving circuit shown in FIG. 1. The structure of the first and second differential circuits 20 and 30 is now explained. The first differential circuit 20 includes a n-channel differential transistor pair 203, 204, driven by a constant current source 209, and a current mirror circuit, made up by p-channel transistors 201 202, connected to an output pair of the differential transistor pair and forming a load circuit of the differential pair. More specifically, the constant current source 209 has its one end connected to the low potential power supply VSS, while having its other end to a common source of the n-channel differential transistors 203 and 204 forming the differential pair. The current mirror is made up by the p-channel transistors 201 202, the sources of which are connected to the high potential power supply VDD. The p-channel transistor 202 is connected in a diode configuration and has its drain and gate connected to the drain of the n-channel transistor 204. The p-channel transistor 201 has its gate connected the gate of the p-channel transistor 202, while having its drain connected to the drain of the n-channel transistor 203. The connection node of the transistors 201 and 203 forms an output end of the differential circuit 20 and is connected to the gate of the p-channel transistor 101. The gate terminals (control terminals) of the n-channel differential transistors 203 and 204 form a non-inverting input terminal and an inverting input terminal of the differential circuit. The input terminal 1 and the output terminal 2 are connected to the gates of the n-channel differential transistor pair 203, 204, respectively.

In the second differential circuit 30, a current mirror circuit 301, 302, composed by n-channel transistors 301 and 302, is connected as a load circuit to an output pair of p-channel transistors 303 and 304, driven by a constant current source 309. Specifically, the constant current source 309 has its one end connected to the high potential power supply VDD, while having its other end connected to a common source of the p-channel transistors 303 and 304 forming the differential pair. The current mirror circuit, forming the active load of the differential pair, is made up by the n-channel transistors 301 and 302, the sources of which are connected to the low potential power supply VSS. The n-channel transistor 302 is connected in a diode configuration and has its drain and gate connected to the drain of the p-channel transistor 304. The n-channel transistor 301 has its gate connected common to the gate of the n-channel transistor 302, while having its drain connected to the drain of the n-channel transistor 303. The connection node of the transistors 301 and 303 forms an output end of the differential circuit 30 and is connected to the gate of the n-channel transistor 102.

The gates of the p-channel differential pair transistors 303 and 304 form the non-inverting input terminal and the inverting input terminal, respectively, while the gates of the p-channel transistors 303 and 304 are connected to the input terminal 1 and to the output terminal 2, respectively.

In the present embodiment, as a structure in which the setting drive voltage V1 of the p-channel transistor 101 is controlled to be lower than the setting drive voltage V2 of the n-channel transistor 102, the n-channel differential pair 203, 204 or the p-channel differential pair 303, 304 is made up by a pair of transistors having differential threshold voltages.

FIG. 5 shows a specified example in a tabulated form. FIG. 5 shows a list of four sorts of settings for the relationship of the threshold voltages Vth of the n-channel differential pair 203, 204 and the p-channel differential pair 303, 304, and the drain-to-source current Ids in the stabilized state. Meanwhile, the suffixes to Vth and Ids denote reference numbers of the transistors shown in FIG. 4.

Referring to FIG. 5, in a case of (1), the threshold voltages Vth 203 and Vth 204, and the drain-to-source currents Ids 203 and Ids 204 of the n-channel differential pair transistors 203 and 204 are set to $$Vth\ 203>Vth\ 204 \text{ and}$$

$$Ids\ 203=Ids\ 204,$$

while the threshold voltages Vth 303 and Vth 304, and drain-to-source current Ids 203 and Ids 204 of the p-channel differential pair transistors 303 and 304 are set to Vth 303=Vth 304 and Ids 303=Ids 304.

Meanwhile, the input voltage to the input terminal 1 is Vin, the setting drive voltage, charged by the p-channel transistor 101 to the output terminal 2, is V1 and the setting drive voltage, discharged to the output terminal 2 by the n-channel transistor 102, is V2.

Figure 6:
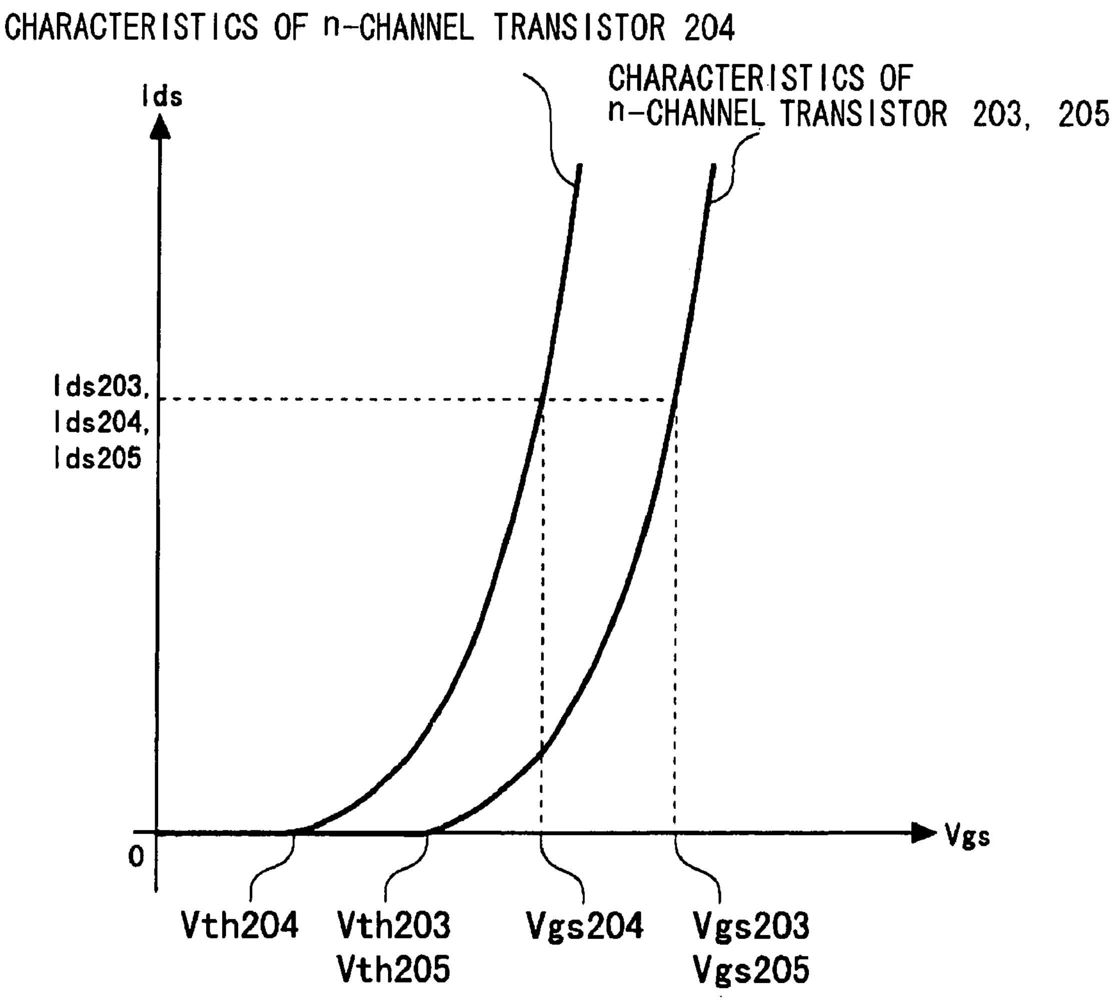
FIG. 6 shows an example of transistor characteristics in the first embodiment of the present invention.

FIG. 6 shows transistor characteristics of the n-channel differential transistor pair 203, 204. This figure shows respective characteristics (V-I characteristics) of the drain-to-source current Ids with respect to the gate-to-source voltage Vgs of the transistors 203 and 204 of FIG. 4.

The characteristic of the transistor 203 is deviated from that of the transistor 204 by a differential of the threshold voltages (Vth 203–Vth 204). Meanwhile, Vgs is the electric potential of the control terminal (gate terminal) with respect to the source and Ids is the current flowing from the drain to the source.

Referring to FIG. 6, the gate-to-source voltages Vgs 203 and Vgs 204 of the n-channel differential pair transistors 203 and 204, in the case of (1), are related to each other by Vgs 203>Vgs 204, with the difference (Vgs 203–Vgs 204) being approximately equal to the differential of the threshold voltages (Vth 203–Vth 204).

The relationship between the input voltage Vin and the first setting drive voltage V1 is the same as that between the gate source voltages 203 and Vgs 204, so that Vin>V1, with the difference (Vin–V1) being approximately equal to the difference of the threshold voltage (Vth 203–Vth 204).

Thus, the first setting drive voltage V1 may be adjusted by controlling the threshold voltages and the drain-to-source currents of the n-channel differential pair 203, 204.

The gate-to-source voltages Vgs 303, Vgs 304 of the p-channel differential pair 303, 304 are related to each other by Vgs 303=Vgs 304 and V2=Vin.

Similarly to the first setting drive voltage V1, the second setting drive voltage V2 may, of course, be adjusted by controlling the threshold voltage and the drain-to-source current.

Thus, by setting as in (1) in FIG. 5, a buffer area, in which neither the p-channel transistor 101 nor the n-channel transistor 102 is in operation, may be provided between V1 and V2 (=Vin). Meanwhile, the control of Ids 203 and Ids 204, Ids 303 and Ids 304 may readily be adjusted by optimally setting the threshold voltages and the sizes of the transistor pairs of the current mirror circuits 201 and 202 and the current mirror circuits 301 and 302, respectively.

In the example (2) of FIG. 5, threshold voltages Vth 203 and Vth 204, and drain-to-source currents Ids 203 and Ids 204 of the n-channel differential pair transistors 203 and 204 are set so that Vth 203=Vth 204 and Ids 203=Ids 204 while threshold voltages Vth 303 and Vth 304, and drain to source currents Ids 303 and Ids 304 of the p-channel differential pair transistors 303 and 304 are set so that Vth 303<Vth 304 and Ids 303=Ids 304.

In this case, the gate-to-source voltages Vgs 203 and Vgs 204 of the n-channel differential pair transistors 203 and 204 are related to each other by Vgs 203=Vgs 204 while the relationship between the input voltage Vin and the setting drive voltage V1 is given by V1=Vin.

On the other hand, the gate-to-source voltages Vgs 303 and Vgs 304 of the n-channel differential pair transistors 303 and 304 are related to each other by Vgs 303<Vgs 304 while the relationship between the input voltage Vin and the setting drive voltage V2 is given by Vin<V2.

Thus, by setting as in (2) in FIG. 5, a buffer area, in which neither the p-channel transistor 101 nor the n-channel transistor 102 is in operation, may be provided between V1 (=Vin) and V2.

In the foregoing, the threshold voltages of one of the n-channel differential pair 203, 204 and the p-channel differential pair 201, 202 are different from those of the other differential pair. Alternatively, the threshold voltages of the transistor pairs of both differential pairs may be different from each other.

Moreover, at least one of the n-channel differential pair 203, 204 and the p-channel differential pair 201, 202 may be formed by paired transistors having different drain-to-source current values Ids. In (3) of FIG. 5, threshold voltages Vth 203 and Vth 204 and drain-to-source currents Ids 203 and Ids 204 are set to Vth 203=Vth 204 and Ids 203>Ids 204 and, threshold voltages Vth 303 and Vth 304 and drain-to-source currents Ids 303 and Ids 304 of the p-channel differential pair 303, 304 are set to, Vth 303=Vth 304 and Ids 303=Ids 304.

In this case, the gate-to-source voltages Vgs 203 and Vgs 204 of the n-channel differential pairs 203, 204 are related to each other by Vgs 203>Vgs 204 while the relationship between the input voltage Vin and the setting drive voltage V1 is given by V1<Vin.

On the other hand, the gate-to-source voltages Vgs 303 and Vgs 304 of the n-channel differential pair transistors 303 and 304 are related to each other by Vgs 303=Vgs 304 while the relationship between the input voltage Vin and the setting drive voltage V2 is given by Vin=V2.

Thus, by setting as in (3) in FIG. 5, a buffer area, in which neither the p-channel transistor 101 nor the n-channel transistor 102 is in operation, may be provided between V1 and V2 (=Vin).

In similar manner, in (4) of FIG. 5, the n-channel differential pairs 203, 204 are set so that Vth 203=Vth 204 and Ids 203=Ids 204 while the p-channel differential pair transistors 303 and 304 are set so that Vth 303=Vth 304 and Ids 303<Ids 304.

In this case, the gate-to-source voltages Vgs 203 and Vgs 204 of the n-channel differential pair 203, 204 are related to each other by Vgs 203=Vgs 204 while the relationship between the input voltage Vin and the setting drive voltage V1 is given by V1=Vin.

On the other hand, the gate-to-source voltages Vgs 303 and Vgs 304 of the p-channel differential pair transistors 303 and 304 are related to each other by Vgs 303<Vgs 304 while the relationship between the input voltage Vin and the setting drive voltage V2 is given by Vin<V2.

Thus, by setting as in (4) in FIG. 5, a buffer area, in which neither the p-channel transistor 101 nor the n-channel transistor 102 is in operation, may be provided between V1 (=Vin) and V2.

By the setting of four sorts from (1) to (4), as shown in FIG. 5, oscillations may be suppressed during the first period of the one data driving period, by the buffer area provided between the setting drive voltages V1 and V2, even if the output terminal is driven at a high speed to the vicinity of the input voltage Vin, while it is also possible to control the range of the buffer area.

Meanwhile, the setting examples of four sorts from (1) to (4), as shown in FIG. 5, several representative techniques for providing the buffer area between the setting drive voltages V1 and V2, in which neither the p-channel transistor 101 nor the n-channel transistor 102 is in operation, are shown. Of course, any other suitable control may be applied for providing the buffer area between the setting drive voltages V1 and V2, based on the combination of the threshold voltage of the differential transistor pair or the drain-to-source current.

In the setting of (1) and (3) of FIG. 5, the output terminal 2 may be driven to high accuracy to a voltage equal to the input voltage Vin, during the second period of the one data driving period, by actuating the n-channel transistor 102 and the constant current source 103 (control during the second data driving period of FIG. 2). On the other hand, in the setting of (2) and (4) of FIG. 5, the output terminal 2 may be driven to a voltage equal to the input voltage Vin by actuating the p-channel transistor 101 and the constant current source 104 (control during the first data driving period of FIG. 2).

Thus, by supplying the target voltage as the input voltage Vin, the output terminal 2 may be driven to the target voltage within one data driving period. Meanwhile, in the setting of (1) and (3) of FIG. 5, the dynamic range, within which the load may be driven to the target voltage to high accuracy, is the voltage range equal to the voltage range of the power supply voltage less a voltage range from the high potential power supply VDD up to the absolute value of the threshold voltage Vth 303 of transistor 303. In the setting of (2) and (4) of FIG. 5, the dynamic range is the voltage range equal to the voltage range of the power supply voltage less a voltage range from the low potential power supply VSS up to the absolute value of the threshold voltage Vth 203 of transistor 203. However, if, in case the control during the first data driving period shown in FIG. 2 is performed, the input voltage Vin is set so that the setting drive voltage V1 will be equal to the target voltage, and if, in case the control during the second data driving period shown in FIG. 2 is performed, the input voltage Vin is set so that the setting drive voltage V2 will be equal to the target voltage, the dynamic range, within which driving to the target voltage may be made to high accuracy, can be enlarged to approximately the voltage range of the power supply voltage. In this case, however, the target voltage is not necessarily coincident with the input voltage Vin.

With the driving circuit, shown in FIG. 4, the driving circuit shown in FIG. 4 is able to realize the operation and the result explained in the preferred embodiments.

[Second Embodiment]

Figure 7:
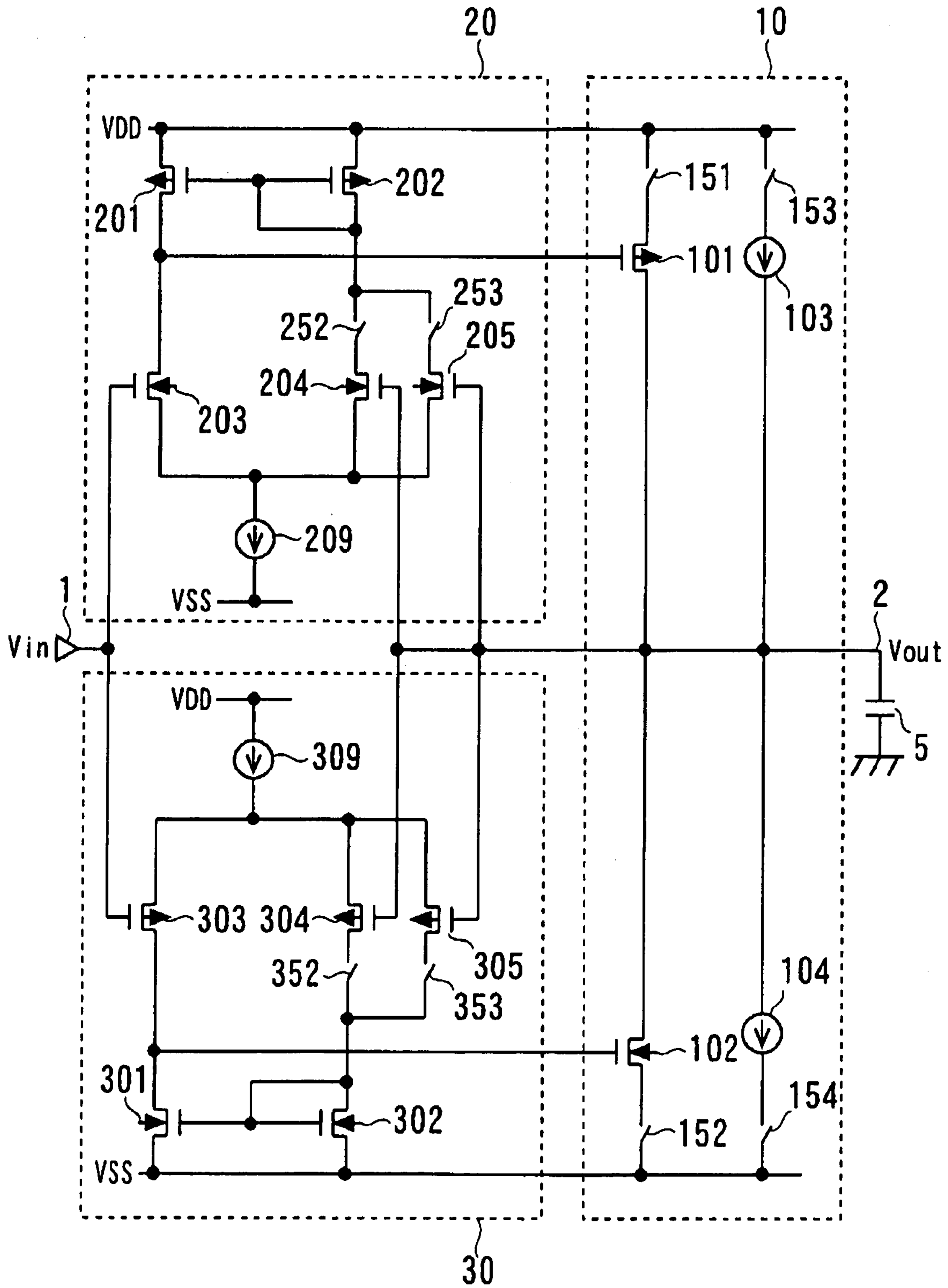
FIG. 7 shows the configuration of a second embodiment of the present invention.

FIG. 7 shows the configuration of a driving circuit of a second embodiment of the present invention, and specifically shows a structure different from FIG. 4 as to the first and second differential circuits 20 and 30 of the driving circuit show in FIG. 1. Referring to FIG. 7, the configuration of the first and second differential circuits 20 and 30 is described in the below. The first and second differential circuits 20 and 30 differ from the structure shown in FIG. 4 as to the configuration of the inverting input end of the differential pair. Referring to FIG. 7, the first differential circuit 20 includes n-channel differential pair transistors 203, 204 and 205, driven by a constant current source 209, and a current mirror circuit, made up by p-channel transistors 201 and 202, connected to an output pair of the differential pair transistors and which form a load circuit of the differential pair. Specifically, the constant current source 209 has its one end connected to the low potential power supply VSS, while having its other end connected to commonly tied sources of the n-channel transistors 203 to 205 forming the differential pair. The current mirror circuit is made up by p-channel transistors 201, 202 and the sources of which are connected to the high potential power supply VDD. The p-channel transistor 202 is connected in a diode configuration. The gates of the p-channel transistors 201 and 202 are connected in common. The n-channel differential pair is made up by the n-channel transistors 203 to 205. The n-channel transistor 203 is connected across the drain of the p-channel transistor 201 and the constant current source 209. A circuit made up of the n-channel transistor 204 and a switch 252 connected in series and a circuit made up of the n-channel transistor 205 and a switch 253 connected in series are connected in parallel to each other across the drain (gate) of the p-channel transistor 202 and the constant current source 209. The connection node between the transistors 201 and 203 forms an output end of the differential circuit 20 and is connected to the gate of the p-channel transistor 101. The gate terminals (control terminals) of the n-channel differential pair transistor 203 forms a non-inverting input terminal of the differential circuit. The gate terminals (control terminals) of the n-channel differential pair transistors 204, 205 are connected in common and form an inverting input end of the differential circuit. The input terminal 1 is connected to the gate of the n-channel differential pair transistor 203, while the output terminal 2 is connected to the gates of the n-channel differential pair transistors 204, 205.

In the second differential circuit 30, the current mirror circuit 301, 302, made up by the n-channel transistors 301 and 302, is connected as a load circuit to an output pair of the p-channel differential pair transistors 303 to 305 driven by the constant current source 309. Specifically, the constant current source 309 has its one end connected to the high potential power supply VDD, while having its other end connected to a common source of the p-channel transistors 303 to 305 forming the differential pair. The current mirror circuit, forming the active load of the differential pair, is made up by the n-channel transistors 301 and 302, the sources of which are connected to the low potential power supply VSS. The n-channel transistor 302 is connected in the diode configuration, while the gates of the n-channel transistors 301 and 302 are connected in common. The p-channel differential pair is made up by the p-channel transistors 303, 304 and 305. The p-channel transistor 303 is connected across the drain of the n-channel transistor 301 and the constant current source 309. A circuit made up of the p-channel transistor 304 and a switch 352 connected in series and a circuit made up of the n-channel transistor 305 and a switch 353 connected in series are connected in parallel to each other across the drain (gate) of the n-channel transistor 302 and the constant current source 309. A connection node of the transistors 301 and 303 forms an output end of the differential circuit 30 and is connected to the gate of the n-channel transistor 102. The gate terminals (control terminals) of the p-channel differential pair transistor 303 form a non-inverting input end of the differential circuit 30. The gate terminals (control terminals) of the p-channel differential pair transistors 304 and 305 are connected in common and form an inverting input end of the differential circuit 30. The input terminal 1 is connected to the gate of the p-channel differential pair transistor 303, while the output terminal 2 is connected to the gates of the p-channel differential pair transistors 304 and 305.

In the present embodiment, as a structure in which the setting drive voltage V1 of the p-channel transistor 101 is set so as to be lower than the setting drive voltage V2 of the n-channel transistor 102, the threshold voltages of the n-channel transistors 203 to 205 are set so that $$Vth\ 203 = Vth\ 205 > Vth\ 204$$

or the threshold voltages of the p-channel transistors 303 to 305 are set so that $$Vth\ 303 = Vth\ 305 < Vth\ 304.$$

The current mirror 201, 202 and the current mirror 301, 302 are each set so that the output (mirror) current is equal in magnitude to the input current.

In the present embodiment, the selection between the n-channel transistor 204 and the n-channel transistor 205 having a threshold voltage different from that of the n-channel transistor 204, is switched based on on/off control of the switches 252 and 253, while the selection between the p-channel transistor 304 and the p-channel transistor 305 having a threshold voltage different from that of the n-channel transistor 304, is switched based on on/off control of the switches 352 and 353. This configuration constitutes one of the features of the present embodiment.

In the present embodiment, thus configured, the setting drive voltage V1 is $$V1 = Vin$$

when the switches 252, 253 have been set to off and on, respectively, and the n-channel transistor 205 has been selected. The setting drive voltage V1 also becomes $$V1 < Vin$$

when the switches 252, 253 have been set to on and off, respectively, and the n-channel transistor 204 has been selected.

The relationship between the input voltage Vin and the setting drive voltage V1 in the present embodiment is now explained, again with reference to FIG. 6. This figure shows typical transistor characteristics for each of the n-channel differential pair transistors 203 to 205 More specifically, respective characteristics of drain-source current Ids to gate source voltages Vgs of the n-channel transistors 203 to 205 of FIG. 7 (V–I characteristics) are shown in FIG. 6. In this figure, the characteristic of the transistor 203 is deviated by a differential of the threshold voltage (Vth 203−Vth 204) from that of the transistor 204. Meanwhile, the transistors 203 and 205 are assumed to be of the same characteristic. Referring to FIG. 6, when the n-channel transistor 205 is selected, the gate-to-source voltages Vgs 203 and Vgs 205 of the n-channel differential pair 203, 205 are related to each other by $$Vgs\ 203 = Vgs\ 205$$

while the input voltage Vin and the setting drive voltage V1 are related to each other by $$V1 = Vin.$$

If, on the other hand, the n-channel transistor 204 is selected, the gate-to-source voltages Vgs 203 and Vgs 204 of the n-channel differential pair 203, 204 are related to each other by $$Vgs\ 203 > Vgs\ 204$$

with the difference (Vgs 203−Vgs 204) being approximately equal to the difference between the threshold voltages or (Vth 203−Vth 204). Sinde the relationship between the input voltage Vin and the first setting drive voltage V1 is equal to the relationship between the gate source voltages Vgs 203 and Vgs 204, $$V1 < Vin$$

with the difference (Vin−V1) being approximately equal to the difference of the threshold voltages (Vth 203−Vth 204). Thus, the first setting drive voltage V1 may be adjusted by controlling the respective threshold voltages of the n-channel differential pair 203 to 205.

On the other hand, in the relationship between the input voltage Vin and the setting driver voltage V2, when the switches 352 and 353 are turned off and on, respectively, such that the p-channel transistor 305 has been selected, the inequality V2=Vin holds, whereas, when the switches 352 and 353 are turned on and off, respectively, such that the p-channel transistor 304 has been selected, the inequality V2>Vin holds, as explained in detail in connection with the n-channel differential pair 203 to 205. The second setting drive voltage V2 may be adjusted by controlling the respective threshold voltages of the p-channel differential pair 303 to 305.

If, in the first period of the one data-driving period, the switch 252 is on and the switch 253 is off, one of the switches 352 and 353 is turned on.

Or, if the switch 352 is on and the switch 353 is off, one of the switches 252 and 253 is turned on.

If, in the present embodiment, the output terminal is driven at a high speed to the vicinity of the input voltage Vin, it is possible to suppress oscillations by the buffer area provided between the setting drive voltages V1 and V2, based on this switching control. This point is among the features representing the outstanding operation and result of the present invention.

Moreover, in the present embodiment, the range of the buffer area may be controlled variably. This point is also among the features representing the outstanding operation and result of the present invention.

In the second period of the one-data driving period, if the p-channel transistor 101 and the constant current source 104 are in operation (in case of control during the first data driving period of FIG. 2), the switches 252 and 253 are turned off and on, respectively, whereas, if the n-channel transistor 102 and the constant current source 103 are in operation, (in case of control during the second data driving period of FIG. 2), the switches 352 and 353 are turned off and on, respectively.

By so doing, the output terminal may be driven to high accuracy to a voltage equal to the input voltage Vin. The dynamic range corresponding to the range of the power supply voltage may be realized by optimum control of the first data driving period or the second data driving period consistent with the input voltage Vin.

Thus, when the target voltage Vin is supplied as the input voltage Vin, the output voltage 2 may be driven to the target voltage within one data driving period. Moreover, the broad dynamic range corresponding to the range of the power supply voltage may be realized.

The driving circuit shown in FIG. 7 is controlled so that, by the structure of the differential circuits 20 and 30, the first setting drive voltage V1, activated for charging by the p-channel transistor 101, is lower than the second setting drive voltage V2, activated for discharging by the n-channel transistor 102, as described above. In this manner, a buffer area, in which neither the p-channel transistor 101, as the first transistor amplifier, nor the n-channel transistor 102, as the second transistor amplifier, is provided in the vicinity of the target voltage, such that, even if the operation of the p-channel transistor 101 and the n-channel transistor 102 is enabled simultaneously, it is possible to prevent the oscillations from occurring, and hence the operation and the result, such as is explained in connection with the above embodiment, may be achieved.

In the above-described embodiments, the inverting input terminal side structure of each of the differential circuits 20 and 30 of FIG. 7 is comprised of two transistors of respective different threshold voltages, connected in parallel with each other. Alternatively, the transistors of the transistor pair forming the differential pair may be composed of a parallel connection of two transistors of respective different current driving capabilities. In this case, the sole transistor is selected by turning on or off the switches, associated with the two transistors of the differential pair having respective different current driving capabilities, during the first and second periods of the one-data driving period.

In the above embodiment, one of the two transistors on the inverting input terminal side of the differential transistor pair, connected in parallel with each other, is controlled to be selected during the first and second periods of the one data driving period. Alternatively, two transistors, connected in parallel with each other, may be controlled to be selected simultaneously. In this case, in e.g. the differential circuit 20 of FIG. 7, the sum of the current driving capabilities of the transistors 204, 205 is set so as to be equal to the current driving capability of the transistor 203. In the first period of the one-data driving period, only one of the switches 252 and 253 is turned on to select only one of the transistors 204 and 205 and, in the second period of the one-data driving period, both the switches 252 and 253 are turned on to select both the transistors 204 and 205. By this switching control, the relationship between the setting drive voltage V1 and the input voltage Vin, which is similar to that in the above-described embodiment, may be achieved.

Moreover, in the above-described embodiments, the inverting input terminal side structure of each of the differential circuits 20 and 30 of FIG. 7 includes two transistors of respective different threshold voltages, connected parallel to each other. The present invention is, however, not limited to this configuration, such that the inverting input terminal side structure may be formed by three or more transistors connected parallel to one another.

In addition, in the above-described embodiments, the inverting input terminal side structure of each of the differential circuits 20 and 30 of FIG. 1, composed of parallel connection of plural transistors, may be provided only on one of the two differential circuits 20 and 30, instead of on both the two differential circuits 20 and 30, because the buffer area may be provided only on one of the differential circuits. However, in this latter case, the differential pair of the other differential circuit needs to be provided by the transistors of the same threshold voltage value or the same current driving capability.

Figure 15:
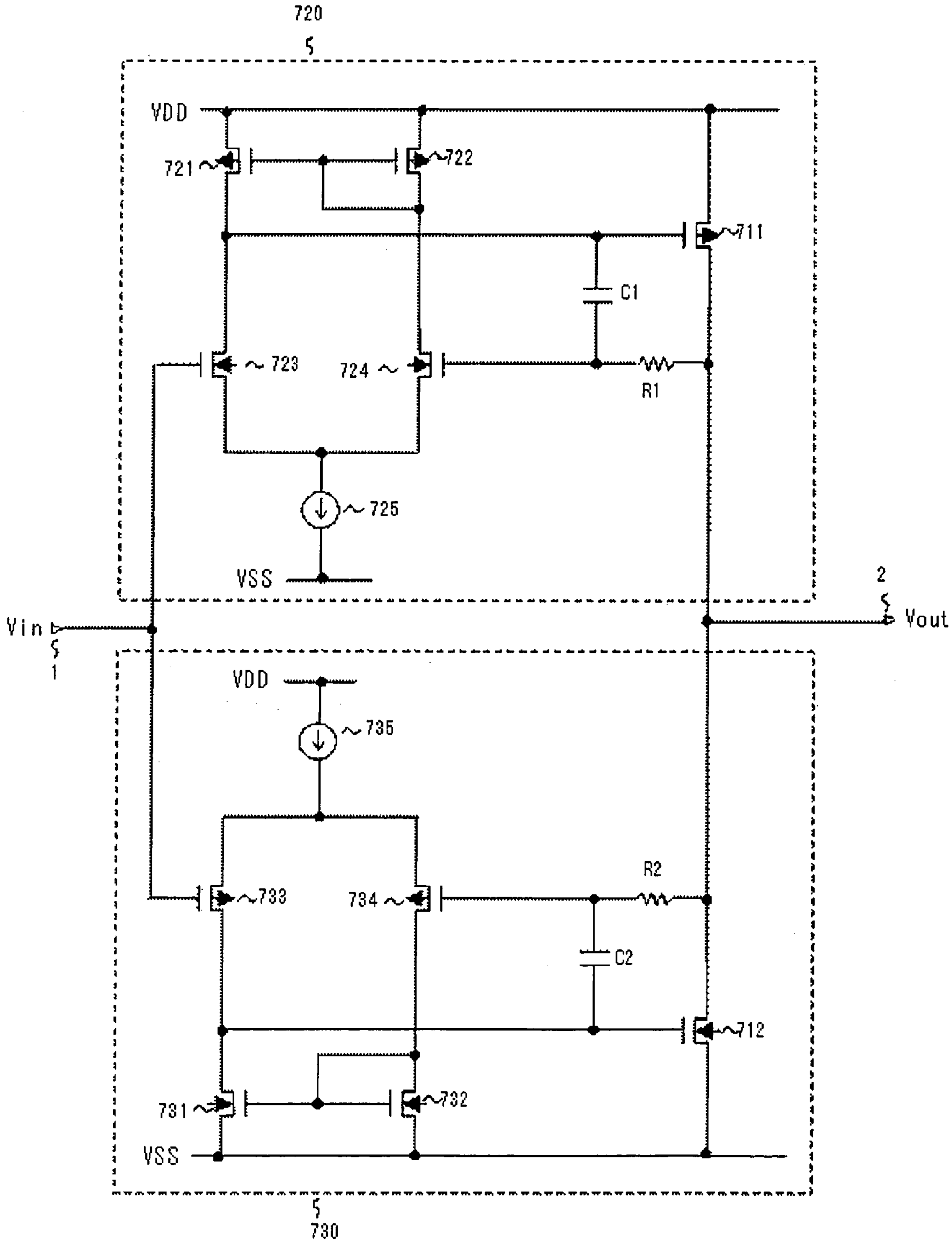
FIG .15 PRIOR ART
FIG. 15 shows the configuration of a conventional amplifier circuit.

Meanwhile, in the driving circuit of the voltage follower configuration, made up by the differential circuits 20 and 30 and the transistor amplifiers 101 and 102, as shown in FIG. 7, the buffer area of the setting drive voltages V1 and V2 is set based on a output offset of the differential amplifier. The present embodiment exploits the output offset for prevention of oscillations and, in this respect, differs from the differential amplifier of FIG. 15. Additionally, the present embodiment switches between the driving having a preset output offset and the driving having a zero output offset and hence differs from the differential amplifier of FIG. 15.

[Third Embodiment]

Figure 8:
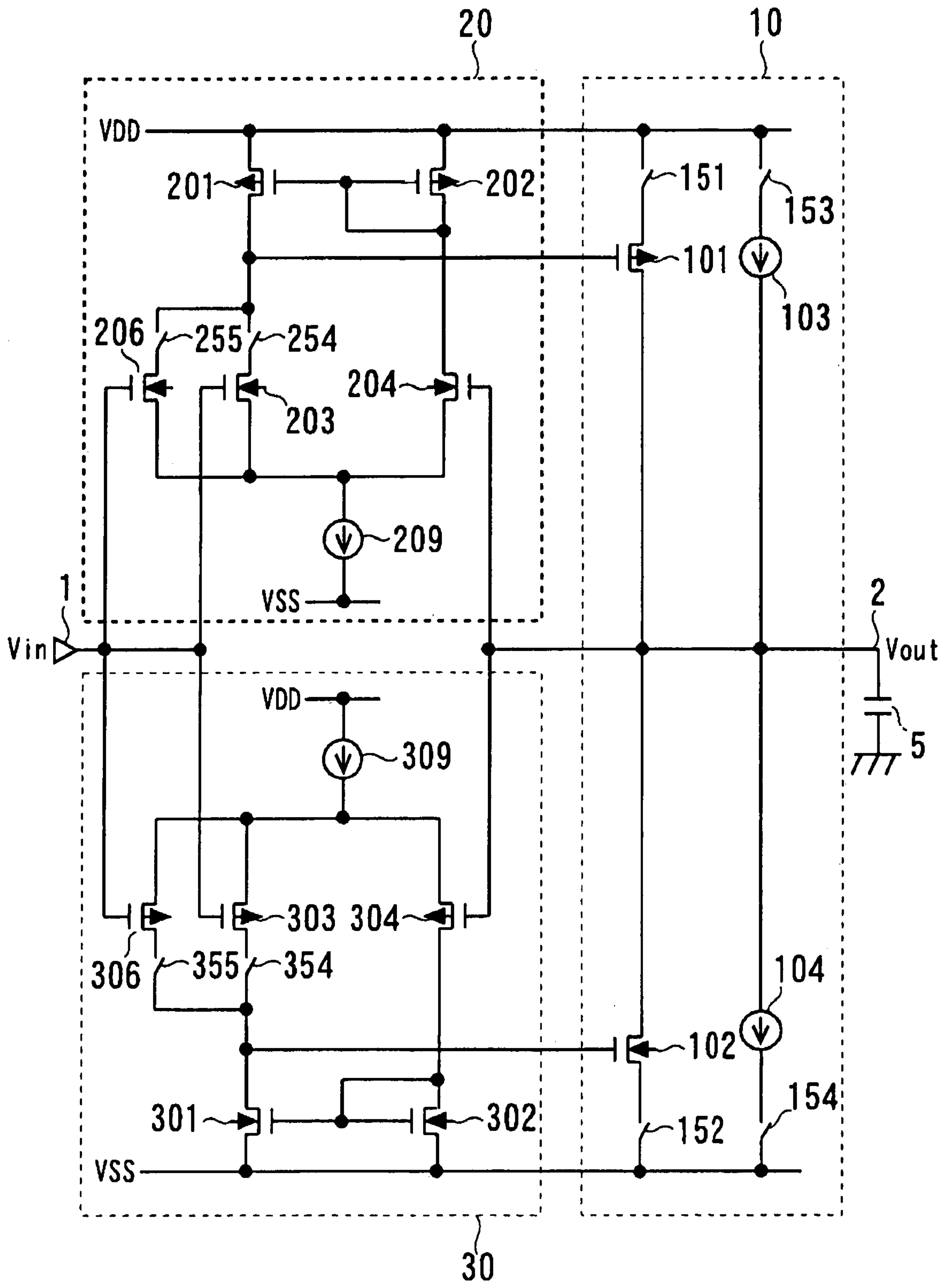
FIG. 8 shows a modification of a third embodiment of the present invention.

FIG. 8 shows a modification of the driving circuit shown in FIG. 7. In the configuration shown in FIG. 7, a parallel connection of two transistors having different threshold voltages is provided on the inverting input end side of the differential pair and one of these transistors is selected. In the circuit shown in FIG. 8, a parallel connection of two transistors having different threshold voltages is provided on the non-inverting input end side of the differential pair and one of these transistors is selected.

In the configuration shown in FIG. 7, plural transistors of the same polarity are connected parallel to each other to the inverting input side of the differential pair. In the circuit configuration according to the present embodiment, as shown in FIG. 8, plural transistors of the same polarity are connected parallel to one another to the non-inverting input side of the differential pair and at least one of these transistors is selected and activated by a switch. Specifically, the n-channel differential pair of the differential circuit 20 is made up by the n-channel transistors 203, 204 and 206. The n-channel transistor 204 is connected across the drain (gate) of the transistor 202 and the constant current source 209. A series connection circuit made up of the n-channel transistor 203 and the switch 254 and another series connection circuit made up of the n-channel transistor 206 and the switch 255 are connected in parallel with each other across the drain of the transistor 201 and the constant current source 209. The gate of the n-channel transistor 204 is connected to the output terminal 2, while the gates of the n-channel transistors 203, 206 are connected to the input terminal 1.

The p-channel differential pair of the differential circuit 30 is made up by p-channel transistors 303, 304 and 306. The p-channel transistor 304 is connected across the drain (gate) of the transistor 302 and a constant current source 309. A series connection circuit made up of the p-channel transistor 303 and the switch 354 and another series connection circuit made up of the p-channel transistor 306 and the switch 355 are connected parallel with each other across the drain of the transistor 301 and the constant current source 309. The gate of the p-channel transistor 304 is connected to the output terminal 2, while the gates of the p-channel transistors 303 and 306 are connected to the input terminal 1. The other configuration is similar to that shown in FIG. 7.

In FIG. 8, as in the second embodiment shown in FIG. 7, an optimum transistor is selected by on/off control of the switches 254, 255, 354 and 355, for each of the first and second periods of the one-data driving period. This gives rise to the same result as that achieved by the second embodiment.

[Fourth Embodiment]

Figure 9:
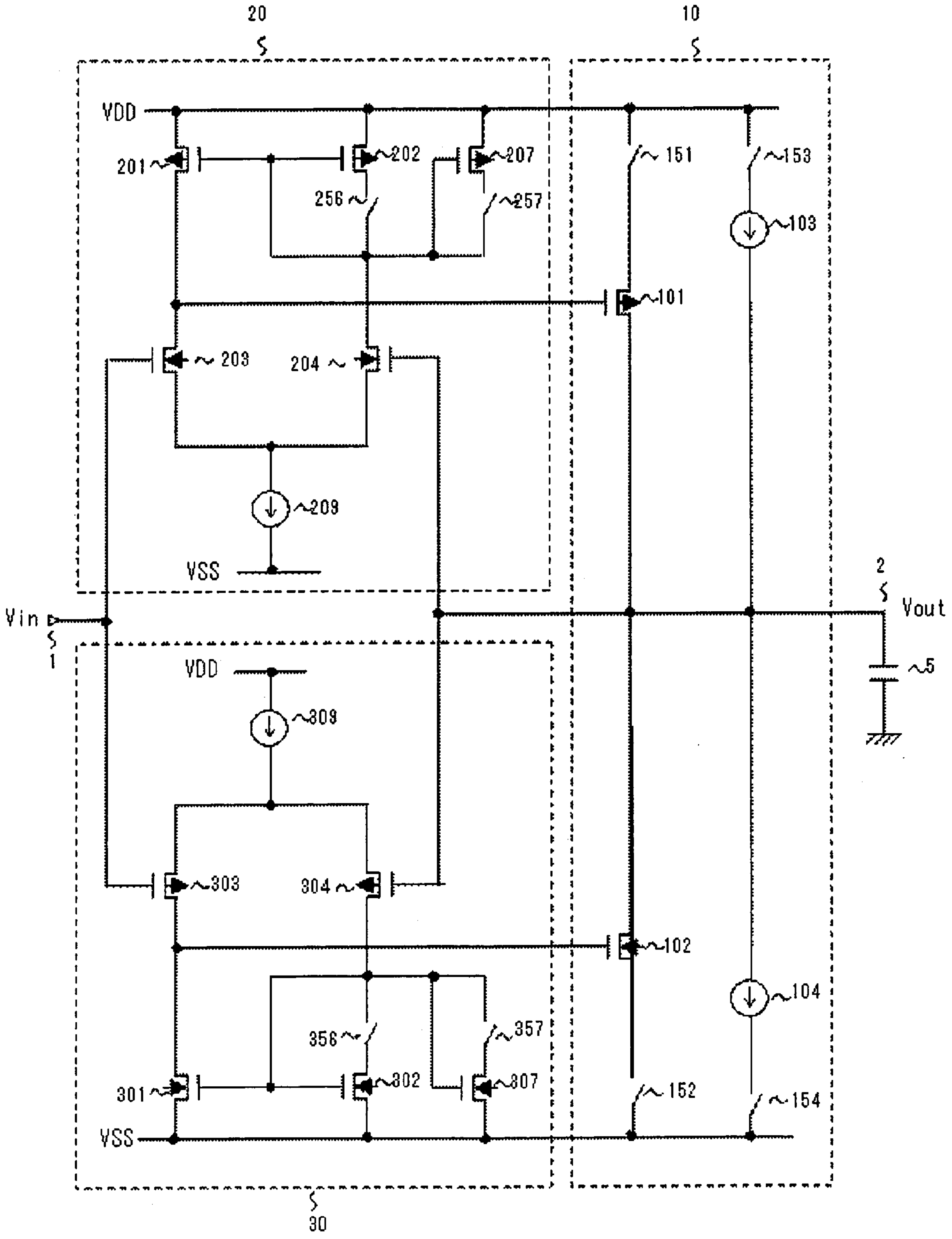
FIG. 9 shows the configuration of a fourth embodiment of the present invention.

FIG. 9 shows the configuration of a driving circuit of a fourth embodiment of the present invention, and specifically shows a modification of the differential circuits 20 and 30 shown in FIG. 1. Referring to FIG. 9, the driving circuit of the present embodiment includes a parallel connection of plural transistors of the same polarity, as the input node side transistors of the current mirror circuit. The n-channel differential pair of the differential circuit 20 is made up by n-channel transistors 203 and 204. An output node side of a current mirror circuit, connected across the output pair of the n-channel differential pair and the high potential power supply VDD, and forming an active load for the n-channel differential pair 203, 204, includes a p-channel transistor 201, connected across the high potential power supply VDD and the drain of the transistor 203. A circuit made up of the p-channel transistor 202 and the switch 256 connected in series and a circuit made up of the p-channel transistor 207 and the switch 257 connected in series are connected parallel with each other across the high potential power supply VDD and the drain of the transistor 204 on the input side of the current mirror circuit. The gates of the p-channel transistors 201, 202 and 207 are connected in common to the drain of the p-channel transistor 204. The threshold voltages of the p-channel transistors 201 and 202 are set so as to be equal to each other. The absolute value of the threshold voltage of the p-channel transistor 207 is set so as to be smaller than that of the p-channel transistor 202. Or, the current driving capabilities of the p-channel transistors 201 and 202 are set so as to be equal to each other, while the current driving capabilities of the p-channel transistors 207 and 202 are set so as to differ from each other. Meanwhile, the n-channel transistors 203 and 204, forming the differential pair, are set so as to have characteristics equal to each other.

The p-channel differential pair of the differential circuit 30 is formed by the p-channel transistors 303 and 304. An output end side of a current mirror circuit, connected across the output pair of the p-channel differential pair and the low potential power supply VSS, and forming an active load for the p-channel differential pair 303, 304, includes a n-channel transistor 301, connected across the low potential power supply VSS and the drain of the transistor 303. A circuit made up of the n-channel transistor 302 and the switch 356 connected in series and a circuit made up of the n-channel transistor 307 and the switch 357 connected in series are connected parallel with each other across the low potential power supply VSS and the drain of the transistor 304 on the input side of the current mirror circuit. The gates of the n-channel transistors 301, 302 and 307 are connected in common and connected to the drain of the p-channel transistor 304. The threshold voltages of the n-channel transistors 301 and 302 are set so as to be equal to each other. The absolute value of the threshold voltage of the n-channel transistor 307 is set so as to be smaller than that of the n-channel transistor 302. Or, the current driving capabilities of the n-channel transistors 301 and 302 are set so as to be equal to each other, while the current driving capabilities of the n-channel transistors 307 and 302 are set so as to differ from each other. Meanwhile, the n-channel transistors 303 and 304, forming the differential pair, are set so as to have characteristics equal to each other.

In the present embodiment, as in the second embodiment shown in FIG. 7, an optimum transistor is selected by on/off control of the switches 256, 257, 356 and 357, for each of the first and second periods of the one-data driving period. This gives rise to the same result as that achieved by the second embodiment. Meanwhile, as a modification of the embodiment shown in FIG. 9, plural transistors of the same polarity may be connected in parallel to one another on the output side of the current mirror circuit, forming the load of the differential pair (side of the transistor 201), and an optimum transistor may be selected for the first and second periods of the one-data driving period, for realizing the result equivalent to that of the above-described second embodiment.

[Fifth Embodiment]

Figure 10:
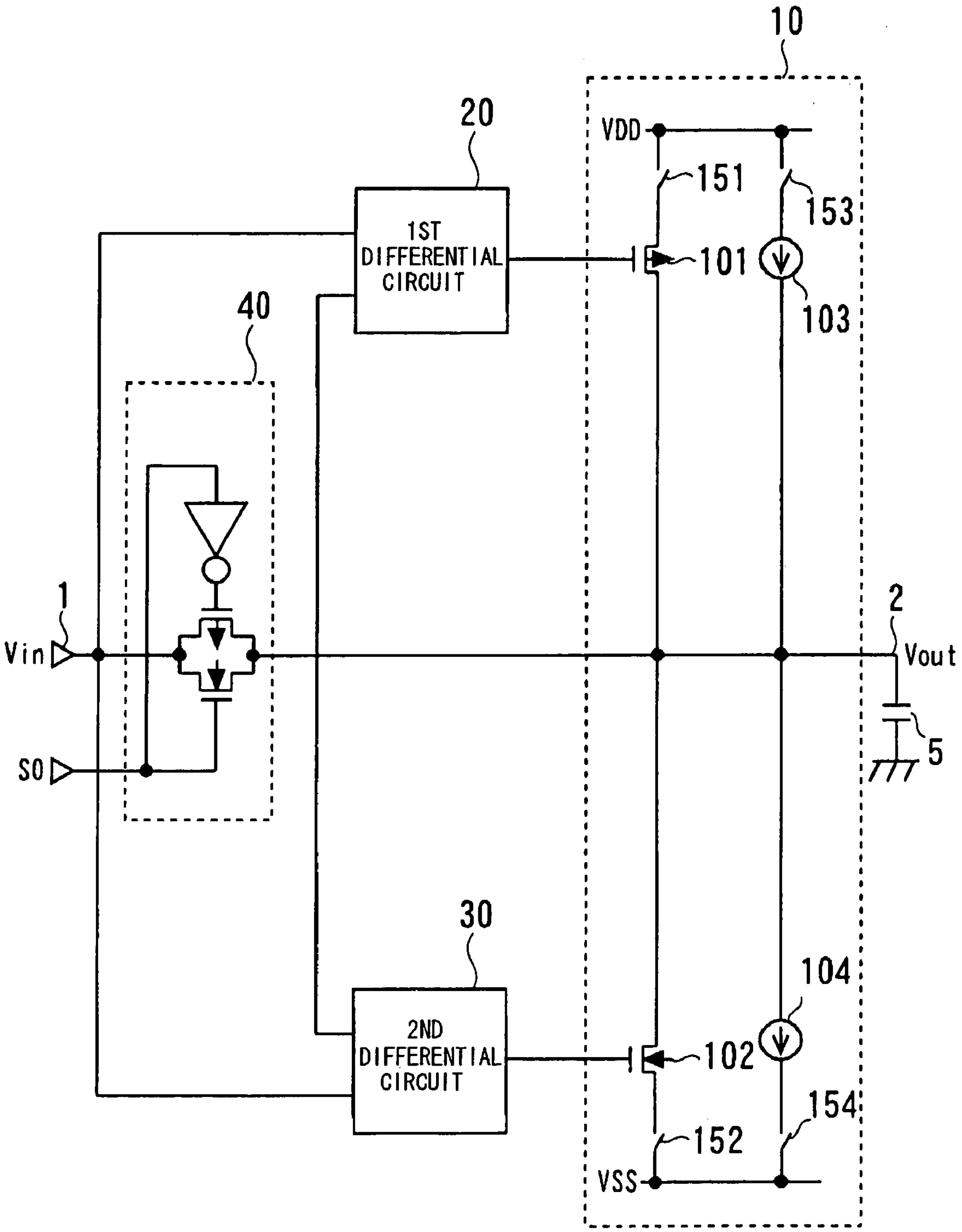
FIG. 10 shows the configuration of a fifth embodiment of the present invention.

FIG. 10 shows the configuration of a fifth embodiment of the driving circuit of the present invention. The present embodiment is equivalent to the embodiments of FIG. 4 and FIGS. 7 to 9 in which there is added a transfer gate switch (CMOS transfer gate) 40, controlled to be turned on or off by a control signal S0, across the input terminal 1 and the output terminal 2.

In the driving circuit, shown in FIG. 10, there is provided, in a one-data driving period, a third period next following the first period and the second period for the one data-driving period. If, during the third period, the switches 151 to 154 are turned off and the transfer gate 40 is turned on, the capacitive load, connected to the output terminal 2, may be directly driven by the current supplying capability of the input voltage Vin applied to the input terminal 1.

[6th Embodiment]

Figure 11:
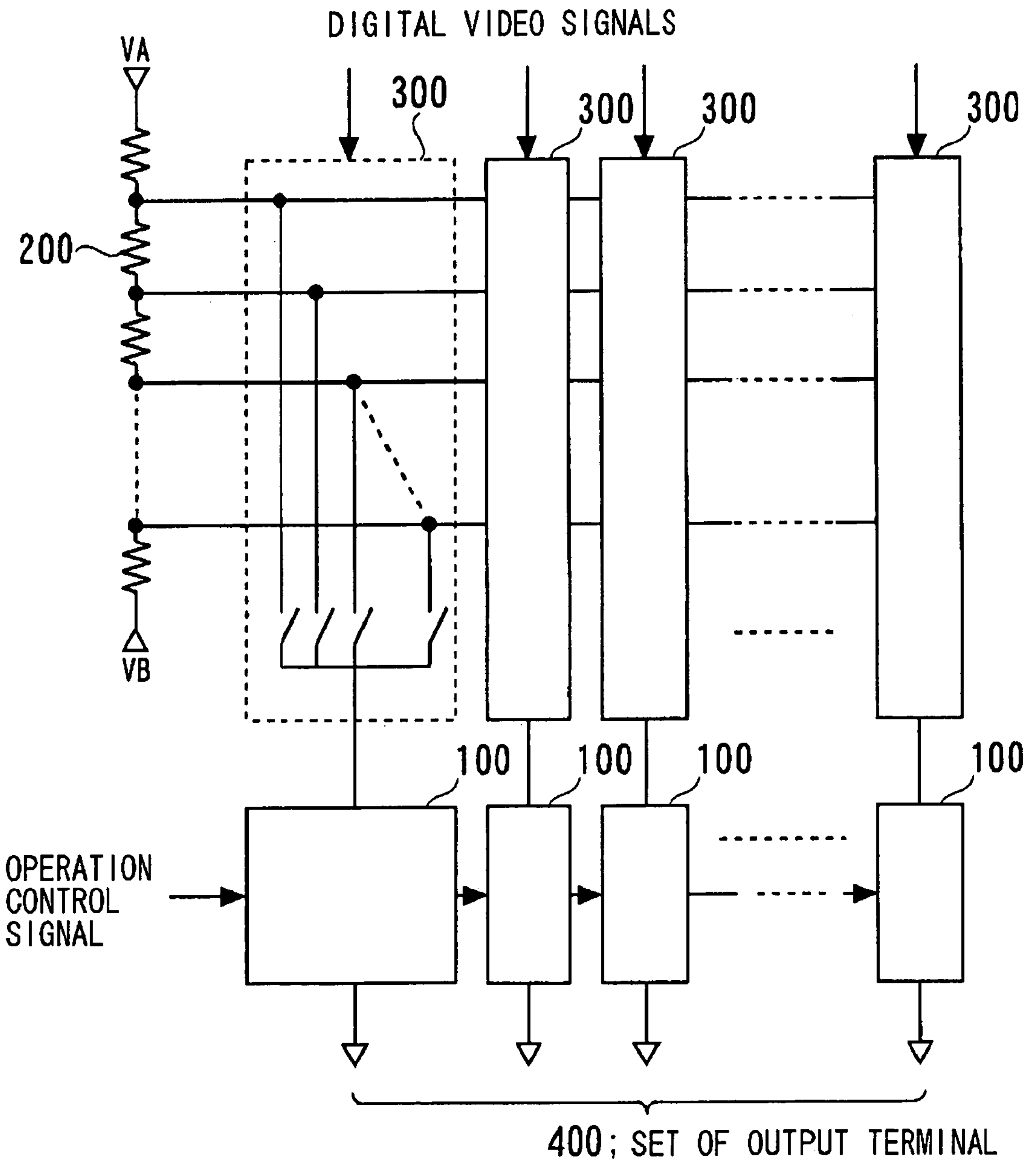
FIG. 11 shows the configuration of a sixth embodiment of the present invention.

FIG. 11 shows a sixth embodiment of a driving circuit of the present invention, and specifically shows the configuration of a data driver of a display apparatus. Referring to FIG. 11, this data driver is made up by a resistor string 200, connected across a power supply VA and a power supply VB, a decoder 300 (selection circuit), a set of output terminals 400, and a buffer circuit 100. For each of output terminals 400, from plural grayscale voltages, generated by respective taps of the resistor string 200, a grayscale voltage is selected by the associated decoder 300, responsive to the digital video signal and is amplified by the associated buffer circuit 100 to drive the data line connected to the output terminal 400. The circuit of the embodiment explained with reference to FIGS. 7 to 9 may be used as the buffer circuit 100. An operation control signal controls the on/off state of each switch in the buffer circuit 100 or the state of activation or non-activation of the circuit unit.

If FIG. 10 is applied to the buffer circuit 100, the resulting structure is such a one in which, when a transfer gate switch 40 of FIG. 10 is turned on, electrical charges are directly supplied from the resistor string 200 to drive the data line.

By employing the driving circuit of the present invention in the output buffer 100 of FIG. 11, a data driver driven at an elevated speed may be constructed extremely readily with only low power dissipation.

Figure 12:
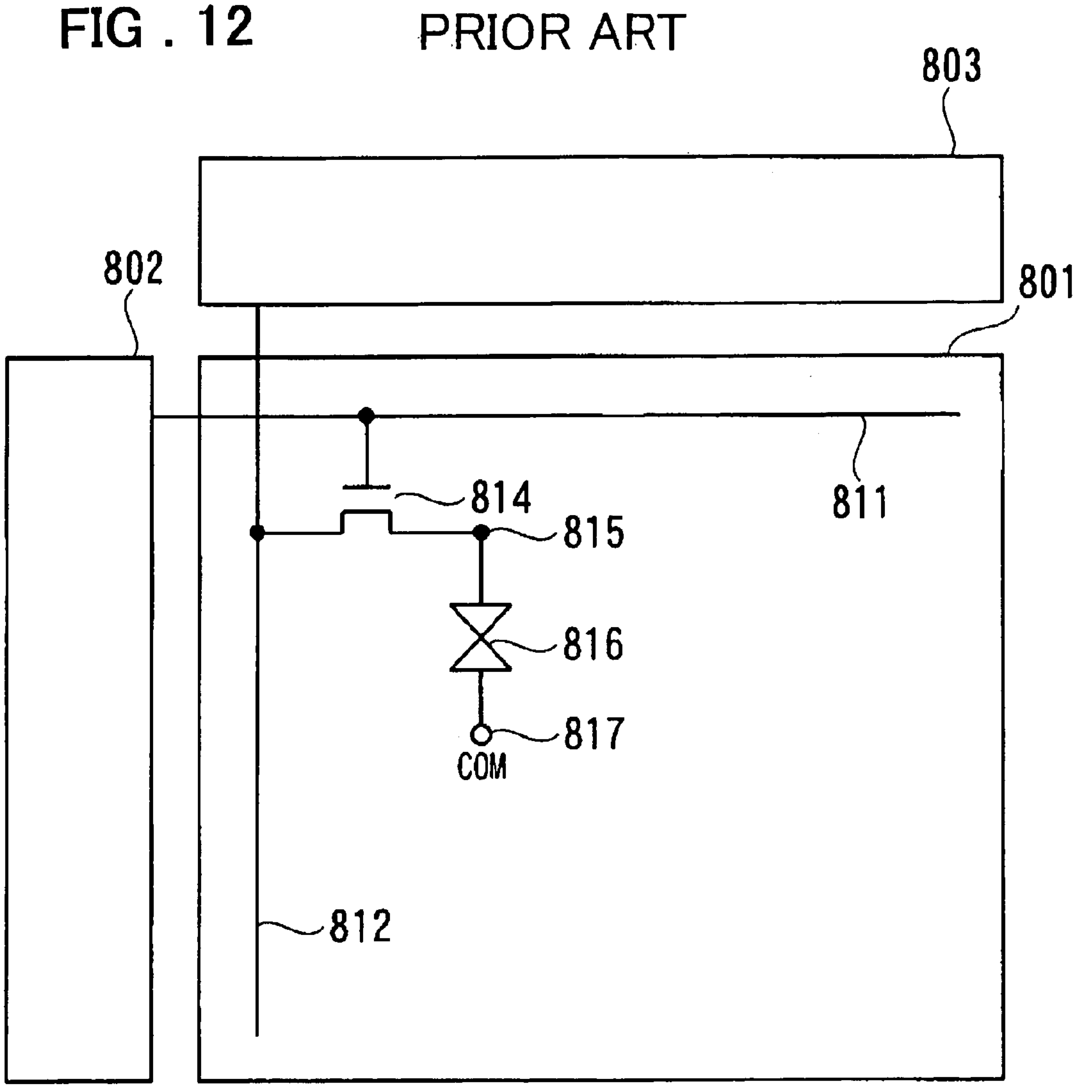
FIG . 12 PRIOR ART
FIG. 12 shows the configuration of a liquid crystal display device.

Meanwhile, the data driver shown in FIG. 11 may, of course, be applied to a data line driving circuit 803 of the liquid crystal driving circuit shown in FIG. 12.

In the embodiments shown in FIG. 4 and in FIGS. 7 to 9, the load of the differential pair transistor, driven by a constant current source, is formed by a current mirror circuit. However, the load of the differential pair transistor may, of course, be formed by a resistor element, on the condition that, if the drain-to-source current flowing through the differential pair is controlled to different values, the combination of different resistance values is to be used.

The driving circuit of the above embodiment is formed by MOS transistors. The driving circuit of the display device may be formed by MOS transistors (TFTs) formed of, for example, polycrystalline silicon.

The differential circuit, explained in the above embodiments, may, of course, be formed by bipolar transistors. In this case, the p-channel transistors of, for example, the current mirror circuit or the differential pair, are formed by pnp transistors, while the n-channel transistors are formed by npn transistors. Although an integrated circuit is used in the above embodiment, a discrete device structure may, of course, be used.

Although the preset invention has been explained with reference to preferred embodiments thereof, the present invention may, of course, comprise various changes or corrections that may readily occur to those skilled in the art within the scope of the invention as set forth in the claims.

The meritorious effects of the present invention are summarized as follows.

According to the present invention, described above, there are provided in one data driving period a first period in which both a transistor amplifier having a charging action and another transistor amplifier having a discharging action are activated, and a second period in which only one of the transistor amplifiers is activated and the constant current source performing an action which is opposite to the action of the transistor amplifier is in operation, whereby the dynamic range equivalent to the range of the power supply voltage may be provided such that the output terminal may promptly be driven to the target voltage at a low power dissipation.

Moreover, according to the present invention, in which the setting drive voltage V1 of the charging transistor amplifier is controlled to a lower potential than the setting drive voltage V2 of the discharging transistor amplifier, it is possible to suppress the oscillations to suppress the phase compensation capacitance to a sufficiently small value, even if both the charging transistor amplifier and the discharging transistor amplifier are operable, thereby achieving the saving in power dissipation and the saving in floor space.

In addition, with the display device according to the present invention, high-speed drawing is possible with low power dissipation, while the picture may be improved in picture quality.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A driving circuit comprising:

a first transistor amplifier and a first current source, arranged in parallel with each other across an output terminal and a high potential power supply for charging said output terminal;

a second transistor amplifier and a second current source, arranged in parallel with each other across said output terminal and a low potential power supply for discharging said output terminal;

a driving period for driving said output terminal responsive to an input signal to a target voltage being made up by at least a first period and a second period; and a control unit for performing control so that, in said first period, one of said first transistor amplifier and said second transistor amplifier is activated, with the other transistor amplifier being inactivated.

2. The driving circuit according to claim 1, wherein, during said first period, a first setting drive voltage of the output terminal, attained by charging by said first transistor amplifier, is lower than a second setting drive voltage of the output terminal, attained by discharging by said second transistor amplifier.

3. The driving circuit according to claim 1, wherein said current source, arranged parallel to say other transistor amplifier being inactivated is activated during said second period.

4. The driving circuit according to claim 1, further comprising:

a first differential circuit including a first differential pair, receiving input signal voltages from a non-inverting input terminal and an inverting input terminal, as differential inputs, an output of said first differential pair being supplied to a control terminal of said first transistor amplifier; and a second differential circuit including a second differential pair, receiving input signal voltages from a non-inverting input terminal and an inverting input terminal, as differential inputs, an output of said second differential pair being supplied to a control terminal of said second transistor amplifier;

at least one of said first differential pair and the second differential pair being formed by a transistor pair with different threshold voltages.

5. The driving circuit according to claim 4, wherein the non-inverting input terminals of said first and second differential circuits are connected in common to an input terminal of the driving circuit and wherein the inverting input terminals thereof are connected in common to said output terminal.

6. The driving circuit according to claim 1, further comprising:

a first differential circuit including a first differential pair, receiving input signal voltages from a non-inverting input terminal and an inverting input terminal, as differential inputs, an output of said first differential pair being supplied to a control terminal of said first transistor amplifier;

a second differential circuit including a second differential pair, receiving input signal voltages from a non-inverting input terminal and an inverting input terminal, as differential inputs, an output of said second differential pair being supplied to a control terminal of said second transistor amplifier;

a plurality of transistors, connected parallel to each other, and having respective different threshold voltages, being provided as one transistor of a transistor pair forming at least one of said first and second differential pairs; said plural transistors having control terminals connected in common to one of the non-inverting input terminal and the inverting input terminal which is different from the input terminal to which is connected the control terminal of the other transistor of the transistor pair forming said one differential pair; and a control circuit for selecting at least one of said plural transistors as said one transistor of the transistor pair forming said one differential pair.

7. The driving circuit according to claim 6, further comprising:

a plurality of switches for controlling on and off of the connection between said plural transistors and a load circuit for said one differential pair; and a control circuit for controlling at least one of said switches so as to be turned on.

8. The driving circuit according to claim 1, further comprising:

a first differential circuit including a first differential pair, receiving input signal voltages from a non-inverting input terminal and an inverting input terminal, as differential inputs, an output of said first differential pair being supplied to a control terminal of said first transistor amplifier;

a second differential circuit including a second differential pair, receiving input signal voltages from a non-inverting input terminal and an inverting input terminal, as differential inputs, an output of said second differential pair being supplied to a control terminal of said second transistor amplifier;

a plurality of transistors, connected parallel to each other, and having respective different current driving capabilities, being provided as one transistor of a transistor pair forming at least one of said first and second differential pairs; said plural transistors having control terminals connected in common to one of the non-inverting input terminal and the inverting input terminal which is different from the input terminal to which is connected the control terminal of the other transistor of the transistor pair forming said one differential pair;

a control circuit for selecting at least one of said plural transistors as said one transistor of the transistor pair forming said one differential pair.

9. The driving circuit according to claim 8, further comprising:

a plurality of switches for controlling on and off of the connection between said plural transistors and a load circuit for said one differential pair; and a control circuit for controlling at least one of said switches so as to be turned on.

10. The driving circuit according to claim 1, further comprising:

a first differential circuit including a first differential pair, receiving input signal voltages from a non-inverting input terminal and an inverting input terminal, as differential inputs, and a first load circuit connected to an output pair of said first differential pair, an output of said first differential pair being supplied to a control terminal of said first transistor amplifier;

a second differential circuit including a second differential pair, receiving input signal voltages from a non-inverting input terminal and an inverting input terminal, as differential inputs, and a second load circuit connected to an output pair of said second differential pair, an output of said second differential pair being supplied to a control terminal of said second transistor amplifier;

at least one of said first load circuit and the second load circuit being composed of a transistor pair formed by a pair of transistors having different threshold voltages.

11. The driving circuit according to claim 1, further comprising:

a first differential circuit including a first differential pair, receiving input signal voltages from a non-inverting input terminal and an inverting input terminal, as differential inputs, and a first load circuit connected to an output pair of said first differential pair, an output of said first differential pair being supplied to a control terminal of said first transistor amplifier;

a second differential circuit including a second differential pair, receiving input signal voltages from a non-inverting input terminal and an inverting input terminal, as differential inputs, and a second load circuit connected to an output pair of said second differential pair, an output of said second differential pair being supplied to a control terminal of said second transistor amplifier;

a plurality of transistors, connected parallel to each other, and having respective different threshold voltages, being provided as at least one transistor of the transistor pair forming at least one of said first and second load circuits; said plural transistors having control terminals connected in common to a control terminal of the other transistor of the transistor pair forming the one load circuit, or to both the control terminal of the other transistor and a connection node of one end of said one load circuit and the associated differential pair; and a control circuit for activating at least one of the plural transistors.

12. The driving circuit according to claim 1, further comprising:

a first differential circuit including a first differential pair, receiving input signal voltages from a non-inverting input terminal and an inverting input terminal, as differential inputs, and a first load circuit connected to an output pair of said first differential pair, an output of said first differential pair being supplied to a control terminal of said first transistor amplifier;

a second differential circuit including a second differential pair, receiving input signal voltages from a non-inverting input terminal and an inverting input terminal, as differential inputs, and a second load circuit connected to an output pair of said second differential pair, an output of said second differential pair being supplied to a control terminal of said second transistor amplifier;

a plurality of transistors, connected parallel to one another, and having respective different current driving capabilities, being provided as at least one transistor of the transistor pair forming at least one of said first and second load circuits; said plural transistors having control terminals connected in common to a control terminal of the other transistor of the transistor pair forming the one load circuit, or to both the control terminal of the other transistor and a connection node of one end of said one load circuit and the associated differential pair; and a control circuit for activating at least one of the plural transistors.

13. The driving circuit according to claim 1, further comprising:

a first differential circuit including a first differential pair, receiving input signal voltages from a non-inverting input terminal and an inverting input terminal, as differential inputs, and a first load circuit connected to an output pair of said first differential pair, an output of said first differential pair being supplied to a control terminal of said first transistor amplifier;

a second differential circuit including a second differential pair, receiving input signal voltages from a non-inverting input terminal and an inverting input terminal, as differential inputs, and a second load circuit connected to an output pair of said second differential pair, an output of said second differential pair being supplied to a control terminal of said second transistor amplifier;

a plurality of resistors of different resistance values being provided to at least one of said first and second load circuits, as at least one of a resistor element of a resistor element pair forming said one load circuit; and a control circuit for selecting at least one of said resistors and for connecting the selected resistor across an output of said differential pair associated with said one load circuit and the power supply associated with said one load circuit, as said one resistor element of the resistor element pair forming said one load circuit.

14. The driving circuit according to claim 1, further comprising:

a first switch connected in series with said first transistor amplifier across said high potential power supply and said output terminal and adapted to be turned on/off by a control signal;

a second switch connected in series with said first current source across said high potential power supply and said output terminal and adapted to be turned on/off by a control signal;

a third switch connected in series with said second transistor amplifier across said low potential power supply and said output terminal and adapted to be turned on/off by a control signal; and a fourth switch connected in series with said second current source across said low potential power supply and said output terminal and adapted to be turned on/off by a control signal.

15. The driving circuit according to claim 14, wherein during said first period, said first and third switches are turned on and said second and fourth switches are turned off; and wherein during said second period, said first and fourth switches are turned on and said second and third switches are turned off or said second and third switches are turned on and said first and fourth switches are turned off.

16. The driving circuit according to claim 1, further comprising a switch provided across an input terminal and said output terminal and turned on/off by a control signal.

17. The driving circuit according to claim 1, further comprising:

a first switch connected in series with said first transistor amplifier across said high potential power supply and said output terminal and adapted to be turned on/off by a control signal;

a second switch connected in series with said first current source across said high potential power supply and said output terminal and adapted to be turned on/off by a control signal;

a third switch connected in series with said second transistor amplifier across said low potential power supply and said output terminal and adapted to be turned on/off by a control signal;

a fourth switch connected in series with said second current source across said low potential power supply and said output terminal and adapted to be turned on/off by a control signal; and a fifth switch connected across an input terminal and said output terminal and adapted to be controlled on/off by a control signal; wherein the driving period for driving said output terminal to a target voltage further having a third period; wherein during said first period, said first and third switches are turned on, said second and fourth switches are turned off and said fifth switch is turned off;

during said second period, said first and fourth switches are turned on, said second and third switch are turned off and said fifth switch is turned off, or said second and third switches are turned on, said first and fourth switches are turned off and said fifth switch is turned off, and wherein during said third period, said first to fourth switches are turned off and said fifth switch is turned on.

18. The driving circuit according to claim 1, further comprising:

a first differential circuit including a third current source connected to said low potential power supply, a first differential pair driven by said third current source and having a non-inverting input terminal and an inverting input terminal connected to an input terminal and said output terminal, respectively, and a first load circuit connected across an output pair of said differential pair and said high potential power supply, an output of said first differential pair being supplied to a control terminal of said first transistor amplifier;

a second differential circuit including a fourth current source connected to said high potential power supply, a second differential pair of the opposite conductivity type to the conductivity type of said first differential pair having a non-inverting input terminal and an inverting input terminal connected to an input terminal and to said output terminal, respectively, and a second load circuit connected across an output pair of said differential pair and said low potential power supply, an output of said second differential pair being supplied to a control terminal of said second transistor amplifier;

a plurality of transistors, connected parallel to each other, and having respective different threshold voltages, being provided as one transistor of a transistor pair forming at least one of said first and second differential pairs; said plural transistors having control terminals connected in common to one of the non-inverting input terminal and the inverting input terminal which is different from the input terminal to which is connected the control terminal of the other transistor of the transistor pair forming said one differential pair;

a plurality of switches connected across said load circuit associated with said one differential pair and said current source driving said one differential pair, in series with each of said transistors, said switches being controlled on/off by a control signal; and a control circuit for controlling at least one of said plural switches so as to be turned on during the driving period driving said output terminal to the target voltage.

19. The driving circuit according to claim 18, further comprising:

a first switch connected in series with said first transistor amplifier across said high potential power supply and said output terminal and adapted to be turned on/off by a control signal;

a second switch connected in series with said first current source across said high potential power supply and said output terminal and adapted to be turned on/off by a control signal;

a third switch connected in series with said second transistor amplifier across said low potential power supply and said output terminal and adapted to be turned on/off by a control signal; and a fourth switch connected in series with said second current source across said low potential power supply and said output terminal and adapted to be turned on/off by a control signal.

20. The driving circuit according to claim 1, further comprising:

a first differential circuit including a third current source connected to said low potential power supply, a first differential pair driven by said third current source and having a non-inverting input terminal and an inverting input terminal connected to an input terminal and said output terminal, respectively, and a first load circuit connected across an output pair of said differential pair and said high potential power supply, an output of said first differential pair being supplied to a control terminal of said first transistor amplifier;

a second differential circuit including a fourth current source connected to said high potential power supply, a second differential pair of the opposite conductivity type to the conductivity type of said first differential pair, having a non-inverting input terminal and an inverting input terminal connected to an input terminal and to said output terminal, respectively, and a second load circuit connected across an output pair of said differential pair and said low potential power supply, an output of said second differential pair being supplied to a control terminal of said second transistor amplifier;

a plurality of transistors, connected parallel to each other, and having respective different current driving capabilities, being provided as one transistor of a transistor pair forming at least one of said first and second differential pairs; said plural transistors having control terminals connected in common to one of the non-inverting input terminal and the inverting input terminal which is different from the input terminal to which is connected the control terminal of the other transistor of the transistor pair forming said one differential pair;

a plurality of switches connected across said load circuit associated with said one differential pair and said current source driving said one differential pair, in series with each of said transistors, said switches being controlled on/off by a control signal; and a circuit for controlling at least one of said plural switches so as to be turned on during the driving period driving said output terminal to a target voltage.

21. The driving circuit according to claim 20, further comprising:

a first switch connected in series with said first transistor amplifier across said high potential power supply and said output terminal and adapted to be turned on/off by a control signal;

a second switch connected in series with said first current source across said high potential power supply and said output terminal and adapted to be turned on/off by a control signal;

a third switch connected in series with said second transistor amplifier across said low potential power supply and said output terminal and adapted to be turned on/off by a control signal; and a fourth switch connected in series with said second current source across said low potential power supply and said output terminal and adapted to be turned on/off by a control signal.

22. The driving circuit according to claim 1, wherein a first setting drive voltage of said output terminal, attained by charging by said first transistor amplifier, and a second setting drive voltage of said output terminal, attained by discharging by said second transistor amplifier, are set to respective different voltage levels with respect to an input level supplied to an input terminal; and wherein a buffer area in which neither the first transistor amplifier nor the second transistor amplifier is in operation is provided between said first and second setting drive voltages.

23. The driving circuit according to claim 22, further comprising a circuit for performing control so that, during said first period, the first and second transistor amplifiers are both activatable, and so that, during said second period, one of said first transistor amplifier and the second transistor amplifier, responsible for driving for charging and driving for discharging, respectively, and the first current source or the second current source, performing the driving in the reverse direction to that of the one transistor amplifier, are both activated, to drive said output terminal to the target voltage.

24. The driving circuit according to claim 22, further comprising a circuit for controlling the setting of the range of said buffer area.

25. The driving circuit according to claim 24, wherein said circuit for controlling the setting of the range of said buffer area includes:

a first differential circuit including a first differential pair of a first conductivity type, supplied with an input voltage supplied to said input terminal and with an output voltage at said output terminal from a non-inverting input end and an inverting input end, respectively, to send a first signal from an output end to said first transistor amplifier; and a second differential circuit supplied with an input voltage supplied to said input terminal and with an output voltage at said output terminal from a non-inverting input end and an inverting input end, respectively, to send a second signal from an output end to said second transistor amplifier; and wherein at least during said first period, said first differential pair and/or said second differential pair are controlled so as to be formed by a transistor pair formed by a pair of transistors having respective different threshold voltages or different current driving capabilities.

26. The driving circuit according to claim 1, further comprising:

a first differential circuit including a first differential pair of a first conductivity type, receiving from a non-inverting input terminal and an inverting input terminal, an input voltage at said input terminal and an output voltage at said output terminal of said driving circuit, respectively and having an output terminal for supplying a first signal to said first transistor amplifier; and a second differential circuit of a second conductivity type, receiving from a non-inverting input terminal and an inverting input terminal, an input voltage at said input terminal and an output voltage at said output terminal, respectively, and having an output terminal for supplying a second signal to said second transistor amplifier;

at least one of said first differential pair and the second differential pair being formed by a transistor pair composed of a pair of transistors having respective different threshold values;

a first setting drive voltage of said output terminal, attained by charging by said first transistor amplifier, and a second setting drive voltage of said output terminal, attained by discharging by said second transistor amplifier, are set to respective different voltage levels with respect to an input level supplied to an input terminal;

a buffer area in which neither the first transistor amplifier nor the second transistor amplifier is in operation is provided between said first and second setting drive voltages; and wherein when control is exercised during the second period of the driving period driving said output terminal to the target voltage, for activating said first transistor amplifier, activating said second constant current source and for inactivating both said second transistor amplifier and the first current source, the input voltage to said input terminal is supplied so that said first setting drive voltage is equal to said target voltage.

27. The driving circuit according to claim 26, wherein, when control is exercised during the second period for activating said second transistor amplifier, activating said first current source and for inactivating both said first transistor amplifier and the second current source, the input voltage to said input terminal is supplied so that said second setting drive voltage is equal to said target voltage.

28. A display apparatus comprising a plurality of data lines for supplying video signals to pixels of a display unit, and a driving circuit as set forth in claim 1 as a circuit for driving said data lines.

* * * * *